(12) United States Patent
Oh

(10) Patent No.: US 8,685,805 B2
(45) Date of Patent: Apr. 1, 2014

(54) SEMICONDUCTOR DEVICES WITH CONNECTION PATTERNS

(75) Inventor: Chang-Woo Oh, Gyeonggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 186 days.

(21) Appl. No.: 13/207,832

(22) Filed: Aug. 11, 2011

(65) Prior Publication Data

US 2011/0300693 A1  Dec. 8, 2011

Related U.S. Application Data

(60) Division of application No. 12/687,286, filed on Jan. 14, 2010, now abandoned, which is a continuation-in-part of application No. 12/146,016, filed on Jun. 25, 2008, now Pat. No. 8,178,924.

(30) Foreign Application Priority Data

Jun. 28, 2007 (KR) .................... 10-2007-0064532
May 29, 2009 (KR) .................... 10-2009-0047514

(51) Int. Cl.
  *H01L 21/20* (2006.01)
(52) U.S. Cl.
  USPC ............ 438/164; 438/39; 438/412; 438/479; 257/E21.377; 257/E29.185
(58) Field of Classification Search
  USPC ............ 438/39, 164, 412, 479; 257/E21.377, 257/E29.185
  See application file for complete search history.

(56) References Cited

U.S. PATENT DOCUMENTS

| | | | |
|---|---|---|---|
| 5,057,450 A | 10/1991 | Bronner et al. | |
| 5,227,658 A | 7/1993 | Beyer et al. | |
| 5,306,659 A | 4/1994 | Beyer et al. | |
| 5,391,911 A | 2/1995 | Beyer et al. | |
| 5,963,817 A | 10/1999 | Chu et al. | |
| 5,972,758 A | 10/1999 | Liang | |
| 6,395,571 B1 * | 5/2002 | Yi et al. | 438/30 |
| 6,414,355 B1 | 7/2002 | An et al. | |
| 6,429,484 B1 | 8/2002 | Yu | |

(Continued)

FOREIGN PATENT DOCUMENTS

| | | |
|---|---|---|
| JP | 10-041512 | 2/1998 |
| JP | 2004-104105 | 4/2004 |

(Continued)

OTHER PUBLICATIONS

"A 4-Bit Double SONOS Memory (DSM) with 4 Storage Nodes Per Cell for Ultimate Multi-Bit Operation," Chang Woo Oh et al., 2006 Symposium on VLSI Technology Digest of Technical Papers, p. 58.

(Continued)

*Primary Examiner* — Alexander Sofocleous
*Assistant Examiner* — John P Dulka
(74) *Attorney, Agent, or Firm* — Muir Patent Consulting, PLLC

(57) ABSTRACT

Provided is a semiconductor device. The semiconductor device includes a semiconductor substrate, a first isolation dielectric pattern on the semiconductor substrate, and an active pattern on the first isolation dielectric pattern. A semiconductor pattern is interposed between the semiconductor substrate and the first isolation dielectric pattern, and a second isolation dielectric pattern is interposed between the semiconductor substrate and the semiconductor pattern. The semiconductor substrate and the semiconductor pattern are electrically connected by a connection pattern.

20 Claims, 38 Drawing Sheets

(56) References Cited

U.S. PATENT DOCUMENTS

| | | |
|---|---|---|
| 6,448,115 B1 | 9/2002 | Bae |
| 6,461,903 B2 | 10/2002 | Lee |
| 6,657,258 B2 | 12/2003 | Bae |
| 6,664,598 B1 | 12/2003 | Dennard et al. |
| 6,670,212 B2 | 12/2003 | McNie et al. |
| 6,670,716 B2 | 12/2003 | Christensen et al. |
| 6,878,978 B2 | 4/2005 | Dokumaci et al. |
| 6,946,314 B2 | 9/2005 | Sawyer et al. |
| 7,015,549 B2 | 3/2006 | Kim et al. |
| 7,045,468 B2 | 5/2006 | Liang |
| 7,052,948 B2 | 5/2006 | Murphy et al. |
| 7,057,926 B2 | 6/2006 | Ohsawa |
| 7,190,007 B2 | 3/2007 | Breitwisch et al. |
| 7,629,651 B2 | 12/2009 | Nakajima |
| 2004/0227181 A1* | 11/2004 | Yeo et al. ............ 257/328 |
| 2005/0186742 A1 | 8/2005 | Oh et al. |
| 2006/0118918 A1 | 6/2006 | Waite et al. |
| 2006/0131666 A1* | 6/2006 | Li et al. ............ 257/387 |
| 2007/0246752 A1 | 10/2007 | Cheng et al. |
| 2008/0029829 A1 | 2/2008 | Yang et al. |
| 2008/0128811 A1 | 6/2008 | Furukawa et al. |
| 2008/0142868 A1 | 6/2008 | Tak et al. |
| 2008/0211023 A1 | 9/2008 | Shino |
| 2010/0117152 A1 | 5/2010 | Oh |

FOREIGN PATENT DOCUMENTS

| | | |
|---|---|---|
| JP | 2008-186827 | 8/2008 |
| KR | 2002-0052458 A | 7/2002 |
| KR | 10-0353468 B1 | 9/2002 |
| KR | 10-2006-0064181 A | 6/2006 |
| KR | 10-2006-0013122 A | 9/2006 |

OTHER PUBLICATIONS

"A Novel Multi-Functional Silicon-On ONO (SOONO) MOSFETs for SoC Applications: Electrical Characterization for High Performance Transistor and Embeded Memory Applications," Chang Woo Oh et al., 2006 Symposium on VLSI Technology Digest of Technical Papers, p. 967.

"A Design of a Capacitorless 1T-DRAM Cell Using Gate-Induced Drain Leakage (GIDL) Current for Low-Power and High-Speed Embedded Memory," E. Yoshida et al., IEDM 2003, p. 913.

"Floating Body RAM Technology and Its Scalability to 32nm Node and Beyond," T. Shino et al., IEDM 2006, p. 569.

"A Study of Highly Scalable DG-FinDRAM," E. Yoshida et al., IEE Electron Device Letters, vol. 26, No. 9, Sep. 2005.

Korean Office Action, KR 10-2003-0085237, Aug. 31, 2005.

"Highly Scalable FBC (Floating Body Cell) with 25nm BOX Structure for Embedded DRAM Applications," T. Shino et al., 2004 Symposium on VLSI Technology Digest of Technical Papers, p. 132-133.

"Floating Body DRAM Characteristics of Silicon-On-ONO (SOONO) Devices for System-on-Chip (SoC) Applications," Chang Woo Oh et al., 2007 Symposium on VLSI Technology Digest of Technical Papers, p. 168-169.

"4-Bit Double SONOS Memories (DSMs) Using Single-Level and Multi-Level Cell Schemes," Chang Woo Oh et al., IEEE 2006.

T. Tanaka et al., "Scalability Study on a Capacitorless 1T-DRAM: From Single-gate PD-SOI to Double-gate FinDRAM", IEEE 2004, 4 pages.

Y. Minami et al., "A Floating Body Cell (FBC) fully Compatible with 90nm CMOS Technology (CMOS IV) for 128Mb SOI DRAM", IEEE 2005, 4 pages.

B. McGaughy et al., Invited Talk 1: "Advanced Simulation Technology and its Application in Memory Design and Verification", Cadence Design Systems, IEEE 2005, 6 pages.

S. Okhonin et al., Invited Talk 2: "Zero Capacitor Embedded Memory Technology for System on Chip", Innovative Silicon, Inc., IEEE 2005, 5 pages.

M. Nagoga et al., "Retention Characteristics of Zero-capacitor RAM (Z-RAM) cell based on FinFET and Tri-Gate devices", IEEE 2007, 2 pages.

R. Ranica et al., "Scaled 1T-Bulk devices built with CMOS 90nm technology for low-cost eDRAM applications", STMicroelectronics, 2005 Symposium on VLSI Technology Digest of Technical Papers, 2 pages.

S. Okhonin et al., "New Generation of Z-RAM", Innovative Silicon, IEEE 2007, 4 pages.

* cited by examiner

SEMICONDUCTOR DEVICES WITH CONNECTION PATTERNS

CROSS-REFERENCE TO RELATED APPLICATIONS

This U.S. non-provisional patent application is a divisional application of application Ser. No. 12/687,286 filed on Jan. 14, 2010 now abandoned, which claims priority under 35 U.S.C. §119 of Korean Patent Application No. 10-2009-0047514, filed on May 29, 2009 and is a continuation in part of U.S. application Ser. No. 12/146,016; filed Jun. 25, 2008 now U.S. Pat. No. 8,178,924 which claims priority to Korean Patent Application No. 10-2007-0064532, filed on Jun. 28, 2007, all of which are incorporated by reference as if set forth fully herein.

BACKGROUND

As a semiconductor device is highly integrated, the elements of a device should be disposed on a substrate at higher density. Because the elements are disposed at narrow distances apart, undesired interaction may occur between the elements. Such interaction degrades reliability of the device. For preventing this, Z various techniques have been proposed for separating the elements.

One technique, which disposes the elements on the SOI substrate, has been proposed as one means for electrically and/or spatially separating the elements. However, limitations that may not occur in existing bulk substrates may be presented when the elements of the device are disposed on the SOI substrate.

SUMMARY

Embodiments of the present invention provide a semiconductor device including: a semiconductor substrate; a first isolation dielectric pattern on the semiconductor substrate; an active pattern on the first isolation dielectric pattern; a semiconductor pattern between the semiconductor substrate and the first isolation dielectric pattern; a second isolation dielectric pattern between the semiconductor substrate and the semiconductor pattern; and a connection pattern connecting the semiconductor substrate and the semiconductor pattern.

In some embodiments, the semiconductor device may further include a gate dielectric and a gate electrode which are sequentially stacked on the active pattern, wherein a depletion layer is generated in the active pattern and the semiconductor pattern when the semiconductor device operates. In other embodiments, the depletion layer may be expanded into the semiconductor substrate.

In still other embodiments, the connection pattern may contact a side surface of the semiconductor pattern and the semiconductor substrate of a one side of the semiconductor pattern.

In even other embodiments, the second isolation dielectric pattern may include the same insulating material as the first isolation dielectric pattern.

In yet other embodiments, the semiconductor substrate and the semiconductor pattern may be electrically connected by the connection pattern.

In further embodiments, the gate electrode may be extended onto a side wall of the active pattern. The first isolation dielectric pattern may be extended between the gate electrode and the active pattern.

In still further embodiments, a channel region in the active pattern may include an undoped semiconductor material, and the semiconductor pattern may include a doped semiconductor material.

In even further embodiments, the connection pattern may include a semiconductor material or a conductive material.

In yet further embodiments, the connection pattern and the semiconductor pattern may include the same material.

Some embodiments of the present invention include methods for manufacturing a semiconductor device. Some embodiments of such methods may include forming a stacked structure in which a sacrificial layer and an active layer are sequentially stacked on a semiconductor substrate, removing the sacrificial layer to form an empty space between the active layer and the semiconductor substrate, and forming a second isolation dielectric pattern on the semiconductor substrate in the empty space. Some embodiments may include forming a semiconductor pattern on the semiconductor substrate, such that the semiconductor pattern is configured to fill the empty space and be separated from the semiconductor substrate. A connection pattern that is configured to connect the semiconductor pattern and the semiconductor substrate may be formed.

In some embodiments, the connection pattern contacts a side surface of the semiconductor pattern and the semiconductor substrate of a one side of the semiconductor pattern. Some embodiments provide that the second isolation dielectric pattern includes the same insulating material as the first isolation dielectric pattern.

Some embodiments provide that the semiconductor substrate and the semiconductor pattern are electrically connected by the connection pattern. In some embodiments, the connection pattern includes a semiconductor material and/or a conductive material. Some embodiments provide that the connection pattern and the semiconductor pattern include the same material.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE FIGURES

The accompanying figures are included to provide a further understanding of the present invention, and are incorporated in and constitute a part of this specification. The drawings illustrate some embodiments of the present invention and, together with the description, serve to explain principles of the present invention. In the figures:

FIGS. 1A through 10A are perspective views illustrating methods for manufacturing semiconductor devices according to some embodiments of the present invention;

FIGS. 1B through 10B are cross-sectional views taken along lines I-I' of FIGS. 1A through 10A, respectively;

FIGS. 1C through 10C are cross-sectional views taken along lines II-II' of FIGS. 1A through 10A, respectively;

FIGS. 11A through 18A are perspective views illustrating methods for manufacturing semiconductor devices according to some embodiments of the present invention;

FIGS. 11B through 18B are cross-sectional views taken along lines I-I' of FIGS. 11A through 18A, respectively;

FIGS. 11C through 18C are cross-sectional views taken along lines II-II' of FIGS. 11A through 18A, respectively;

DETAILED DESCRIPTION OF EXEMPLARY EMBODIMENTS

Figure 1A:
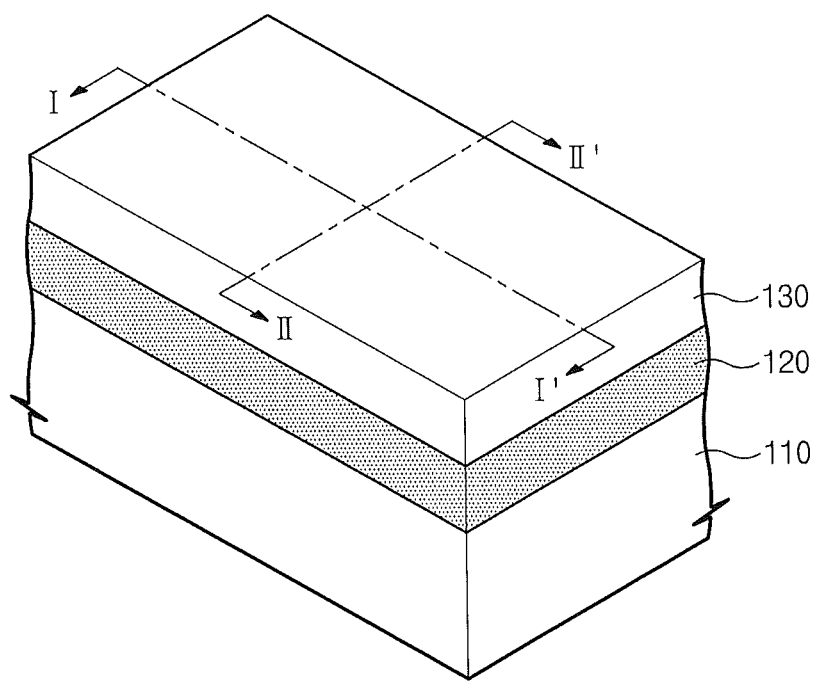

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Figure 10A:
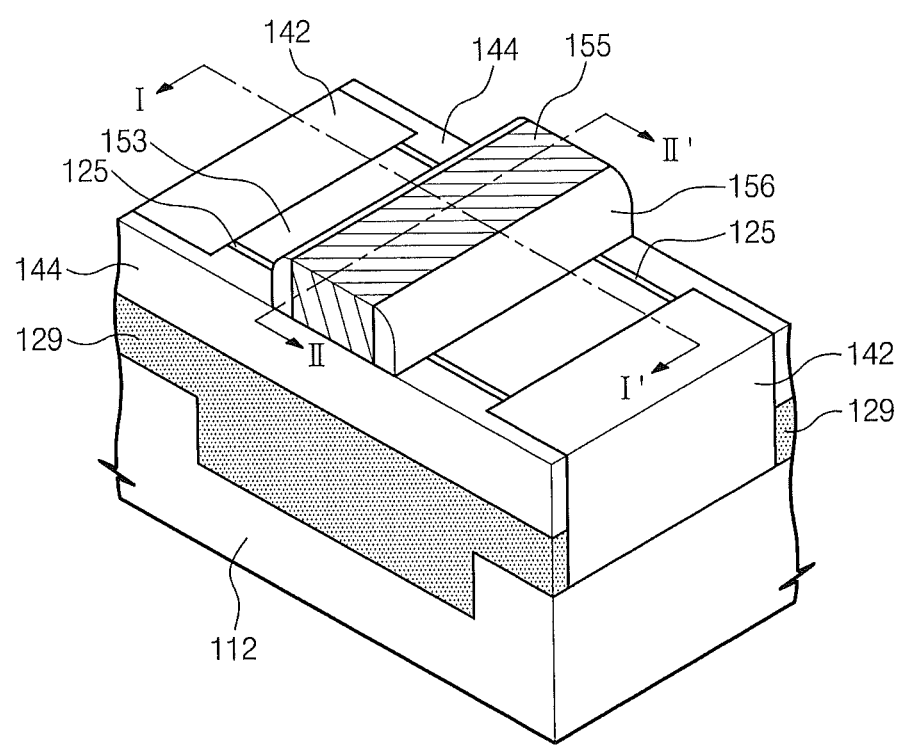
Figure 10B:
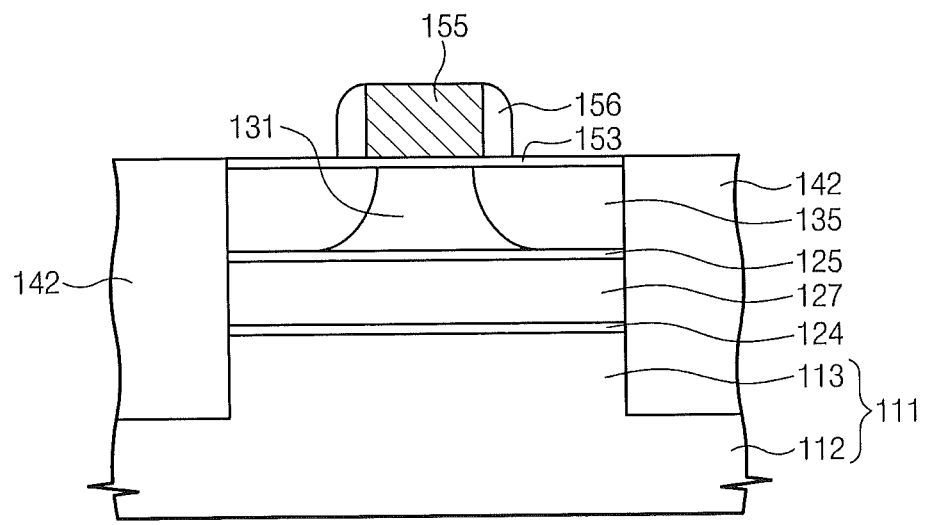
Figure 10C:
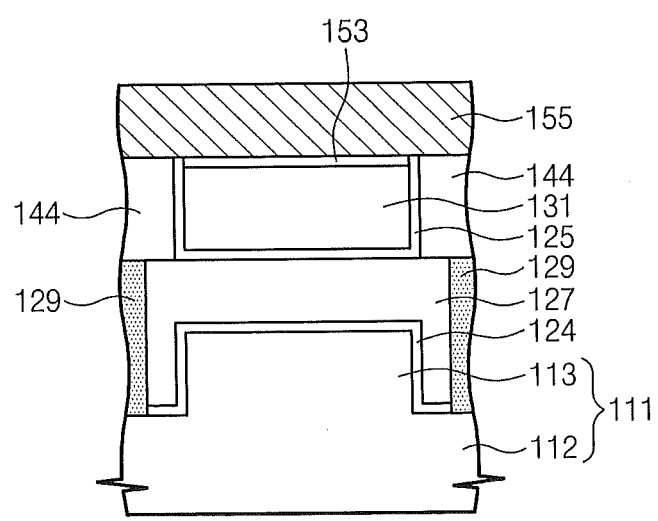

A semiconductor device according to an embodiment of the present invention will be described with reference to FIGS. 10A through 10C. FIG. 10A is a perspective view illustrating a semiconductor device according to an embodiment of the present invention. FIGS. 10B and 10C are cross-sectional views of the semiconductor device taken along lines I-I' and II-II' of FIG. 10A, respectively.

A semiconductor substrate 111 is provided. The semiconductor substrate 111 may include a bottom portion 112, and a protrusion portion 113 that protrudes from the bottom portion 112. The semiconductor substrate 111 may include a single crystal semiconductor material. The semiconductor substrate 111 may include a well region in which dopants are doped. At least one portion of the well region may be disposed in the protrusion portion 113.

In some embodiments, the side wall and upper surface of the protrusion portion 113 of the semiconductor substrate 111 may be surrounded by a second isolation dielectric pattern 124. A portion of an upper surface of the bottom portion 112 adjacent to the protrusion portion 113 may also be covered by the second isolation dielectric pattern 124. At least one portion of the bottom portion 112 of the semiconductor substrate 111 may not be covered by the second isolation dielectric pattern 124. If the semiconductor substrate 111 is a flat form that does not include a protrusion portion, the second isolation dielectric pattern 124 may be disposed only on a portion of the upper surface of the semiconductor substrate 111.

The second isolation dielectric pattern 124 may include a dielectric material. The second isolation dielectric pattern 124 may include at least one of dielectric layers that include an oxide layer, a nitride layer and/or an oxynitride layer, among others. For example, the second isolation dielectric pattern 124 may be an Oxide-Nitride-Oxide (ONO) layer.

In some embodiments, a semiconductor pattern 127 may be disposed on the second isolation dielectric pattern 124. The semiconductor pattern 127 may cover the upper surface of the second isolation dielectric pattern 124. In the case where the semiconductor substrate 111 includes the protrusion portion 113, the semiconductor pattern 127 may cover the upper surface and side wall of the protrusion portion 113 of the semiconductor substrate 111. The side wall of the semiconductor pattern 127 and a side surface constituting the one end of the second isolation dielectric pattern 124 may be coplanar. The semiconductor pattern 127 may be separated from the semiconductor substrate 111 by the second isolation dielectric pattern 124.

The semiconductor pattern 127 may include a semiconductor material. In some embodiments, the semiconductor pattern 127 may include a multi-crystal semiconductor material. Dopants may be doped in the semiconductor pattern 127, or the semiconductor pattern 127 may not be doped.

A connection pattern 129, which may connect the semiconductor substrate 111 and the semiconductor pattern 127, may be disposed. In some embodiments, the connection pattern 129 may have a lower surface contacting the semiconductor substrate 111 and a side wall contacting the semiconductor pattern 127.

The connection pattern 129 may include a semiconductor material and/or a conductive material. For example, the connection pattern 129 may include a doped semiconductor material, an undoped semiconductor material, a metal and/or a metal compound, among others. In some embodiments, the connection pattern 129 may be formed of the same material as that of the semiconductor pattern 127. Although not illustrated, some embodiments provide that the connection pattern 129 and the semiconductor pattern 127 may not have a boundary surface. That is, the connection pattern 129 and the semiconductor pattern 127 may constitute a single layer.

The semiconductor substrate 111 and the semiconductor pattern 127 may be electrically connected by the connection pattern 129. In other words, the semiconductor substrate 111 and the semiconductor pattern 127 may be spatially separated by the second isolation dielectric pattern 124, but they may be electrically connected via the connection pattern 129.

An active pattern 131 is disposed on the semiconductor pattern 127. A first isolation dielectric pattern 125 may be interposed between the semiconductor pattern 127 and the active pattern 131. In an embodiment, the active pattern 131 may be disposed in a certain region that is surrounded by the first isolation dielectric 125. The active pattern 131 may be separated from other elements on the semiconductor substrate 111 by the first isolation dielectric pattern 125.

The active pattern 131 may include a semiconductor material. For example, the active pattern 131 may include a semiconductor material having a single crystal state. A source/drain region 135 may be disposed in the active pattern 131. In some embodiments, the bottom of the source/drain region 135 may be extended to the lower surface of the active pattern 131. That is, the bottom of the source/drain region 135 and a portion of the bottom of the active pattern 131 may be defined as the same surface.

In some embodiments, the semiconductor device may include the active pattern 131 that includes the doped semiconductor pattern 127 and an undoped channel region. In this case, the active pattern 131 may be formed to a thickness thinner than that of a case in which the active pattern 131 is doped.

A gate dielectric pattern 153 and a gate electrode 155 may be stacked on the active pattern 131. A spacer 156 may be disposed on the side wall of the gate electrode 155. In embodiments where the elements of a device are disposed on a Silicon On Insulator (SOI) substrate, other limitations that do not occur in a bulk substrate may occur. For example, it may be difficult to control a threshold voltage. Thus, some embodiments may be operable to apply a SOI device to an integrated circuit that is compatible with a device having various threshold voltages.

According to some embodiments of the present invention, however, the threshold voltage of the SOI device may be easily controlled.

According to some embodiments, specifically, a first isolation dielectric 125 that serves as the buried oxide of the SOI device may be formed to a very thin thickness. In some embodiments, the first isolation dielectric 125 may be formed to a thickness less than about 10 nm. According to some embodiments, additionally, the semiconductor pattern 127 may be connected to the semiconductor substrate 111 by the connection pattern 129. Consequently, an operation voltage may be applied to the semiconductor pattern 127 through the semiconductor substrate 111. A back bias may be maintained in the active pattern 131 by the operation voltage that is applied to the semiconductor pattern 127.

Moreover, the semiconductor pattern 127 may be disposed under the lower surface of the active pattern 131, and thus can perform a lower gate function of controlling the active pattern 131. In this regard, the first isolation dielectric 125 may perform the function of the gate dielectric of the lower gate.

That is, the semiconductor substrate 111 and the semiconductor pattern 127 may be electrically connected. Moreover, the first isolation dielectric 125 may be formed to a very thin thickness, and thus, even in a case in which the first isolation dielectric 125 is interposed, a voltage applied to the semiconductor substrate 111 may have influence on the active pattern 131. Accordingly, by controlling the operation voltage that is applied to the semiconductor substrate 111 and/or the semiconductor pattern 127, the threshold voltage may be controlled. Therefore, an integrated circuit in which a device having various threshold voltages is integrated can be easily manufactured.

In use and operation of a semiconductor device according to some embodiments of the present invention, a depletion layer may be generated in the active pattern 131. The depletion layer may be generated in the entire region of the active pattern 131. As described above, because the first isolation dielectric 125 surrounding the lower surface and side wall of the active pattern 131 is formed to a very thin thickness, the depletion layer may be extended to the inside of the semiconductor pattern 127. Moreover, the depletion layer may be expanded to the inside of the semiconductor substrate 111 according to the intensity of an applied voltage.

Methods for manufacturing a semiconductor device according to some embodiments of the present invention will be described below with reference to FIGS. 1A through 1C, FIGS. 2A through 2C, FIGS. 3A through 3C, FIGS. 4A through 4C, FIGS. 5A through 5C, FIGS. 6A through 6C, FIGS. 7A through 7C, FIGS. 8A through 8C, FIGS. 9A through 9C and FIGS. 10A through 10C. FIGS. 1A through 10A are perspective views illustrating methods for manufacturing semiconductor devices according to some embodiments of the present invention. FIGS. 1B through 10B are cross-sectional views taken along lines I-I' of FIGS. 1A through 10A, respectively. FIGS. 1C through 10C are cross-sectional views taken along lines II-II' of FIGS. 1A through 10A, respectively.

Methods for manufacturing the semiconductor device according to some embodiments of the present invention may include forming a stacked structure in which a sacrificial layer and an active layer are sequentially stacked on a semiconductor substrate. Methods may include removing the sacrificial layer to form an empty space between the active layer and the semiconductor substrate and forming a second isolation dielectric pattern on the semiconductor substrate in the empty space. Methods may include forming a semiconductor pattern on the semiconductor substrate, the semiconductor pattern filling the empty space and being separated from the semiconductor substrate and forming a connection pattern which connects the semiconductor pattern and the semiconductor substrate.

Figure 1B:
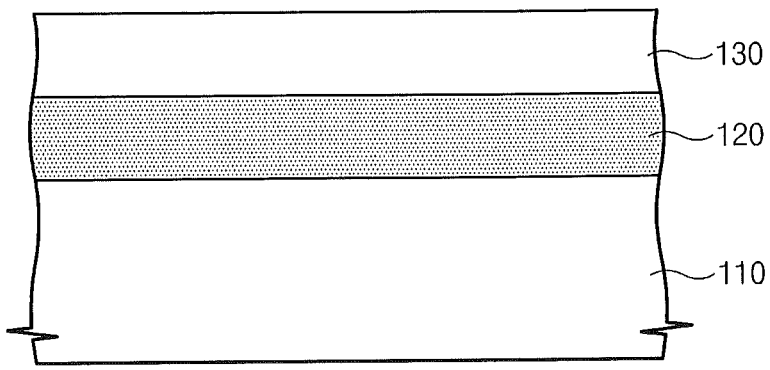
Figure 1C:
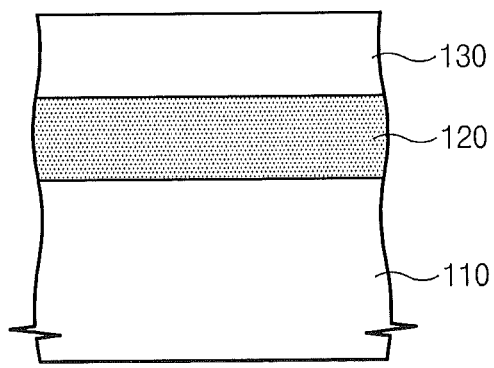

Referring to FIGS. 1A through 1C, a sacrificial layer 120 and an active layer 130 are sequentially stacked on a semiconductor substrate 110. The semiconductor substrate 110 may be a bulk substrate consisting of a semiconductor element. The semiconductor substrate 110 may include a well region.

In some embodiments, the sacrificial layer 120 and the active layer 130 may be formed on a portion of the semiconductor substrate 110. For example, the semiconductor substrate 110 may include a SOI region and a bulk region. The sacrificial layer 120 and the active layer 130 may be formed in the SOI region of the semiconductor substrate 110. The semiconductor substrate 110 including the SOI region and the bulk region is prepared, and a mask layer may be formed on the semiconductor substrate 110 of the bulk region. At this point, the semiconductor substrate 110 of the SOI region may be exposed. Subsequently, by using the mask layer as an etching mask, the semiconductor substrate 110 of the SOI region may be anisotropic etched. The sacrificial layer 120 and the active layer 130 may be sequentially stacked in the SOI region of the etched semiconductor substrate 110. According to some embodiments of the present invention, as described above, both the SOI region and the bulk region may be formed at one bulk substrate.

In some embodiments, the semiconductor substrate 110 including the sacrificial layer 120 and the active layer 130 may be formed by removing the sacrificial layer 120 and the active layer 130 on a portion of the semiconductor substrate 110 after forming the sacrificial layer 120 and the active layer 130 on entire of the semiconductor substrate.

The sacrificial layer 120 may include a material having an etch selectivity with respect to the semiconductor substrate 110 and the active layer 130. For example, the sacrificial layer 120 may include a single crystal silicon germanium (Si—Ge). The sacrificial layer 120 may be formed by an epitaxial growth method that uses the semiconductor substrate 110 as a seed layer.

The active layer 130 may include a semiconductor material. In some embodiments, the active layer 130 may be a layer consisting of a single crystal silicon. The active layer 130 may be formed by an epitaxial growth method that uses the sacrificial layer 120 as a seed layer.

Figure 2A:
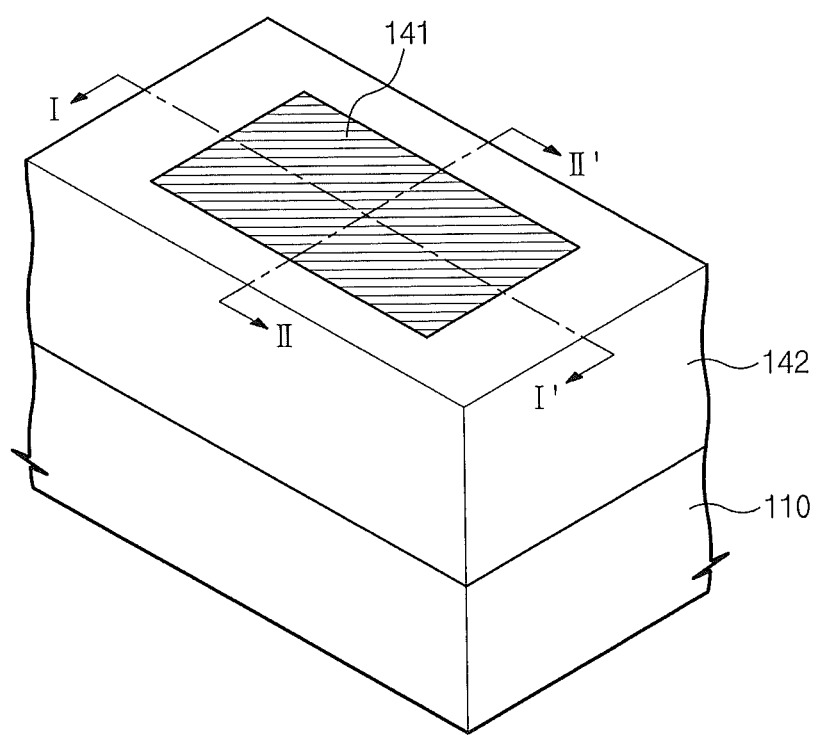
Figure 2B:
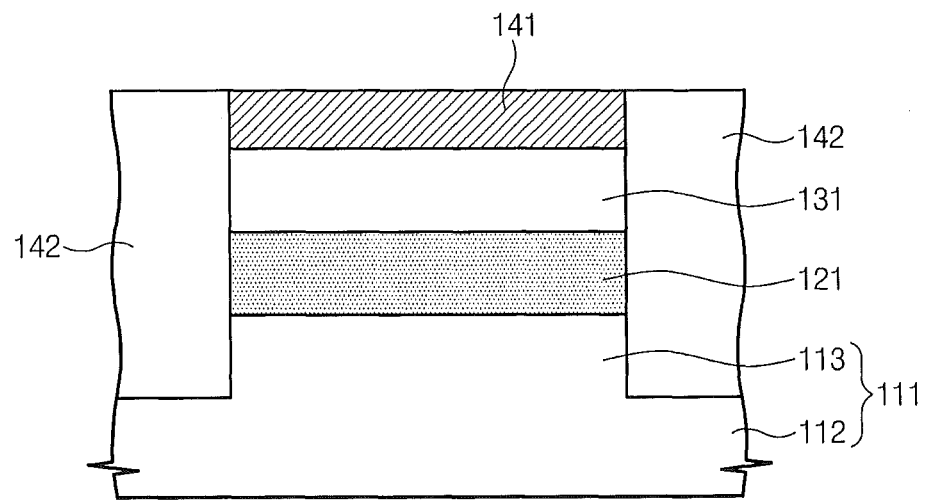
Figure 2C:
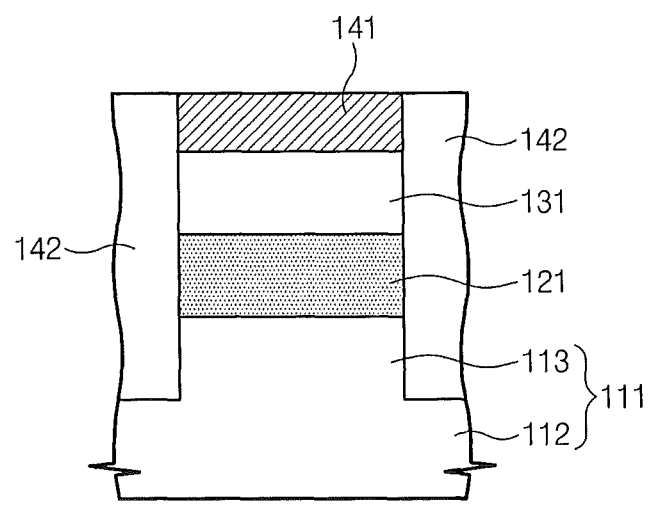

Referring to FIGS. 2A through 2C, a sacrificial pattern 121 and the active pattern 131 are formed by patterning the sacrificial layer 120 and the active layer 130. The patterning process may include forming a first mask 141 on the sacrificial layer 120 and the active layer 130 and anisotropic etching the sacrificial layer 120 and the active layer 130 by using the first mask 141 as an etching mask.

In the anisotropic etching, the semiconductor substrate 110 may serve as an etch stop layer. In this case, a portion of the semiconductor substrate 110 may be etched. The etched semiconductor substrate 111 may include a bottom portion 112, and a protrusion portion 113 that protrudes from the bottom portion 112. A support dielectric 142 may be formed on the semiconductor substrate 111. The support dielectric 142 may cover the upper surface of the bottom portion 112 of the semiconductor substrate 111, the protrusion portion 113 of the semiconductor substrate 111, the side walls of the first mask, the sacrificial pattern 121 and/or the active pattern 131. The upper surface of the support dielectric 142 may be planarized, and thus the upper surface of the first mask 141 may be exposed.

Figure 3A:
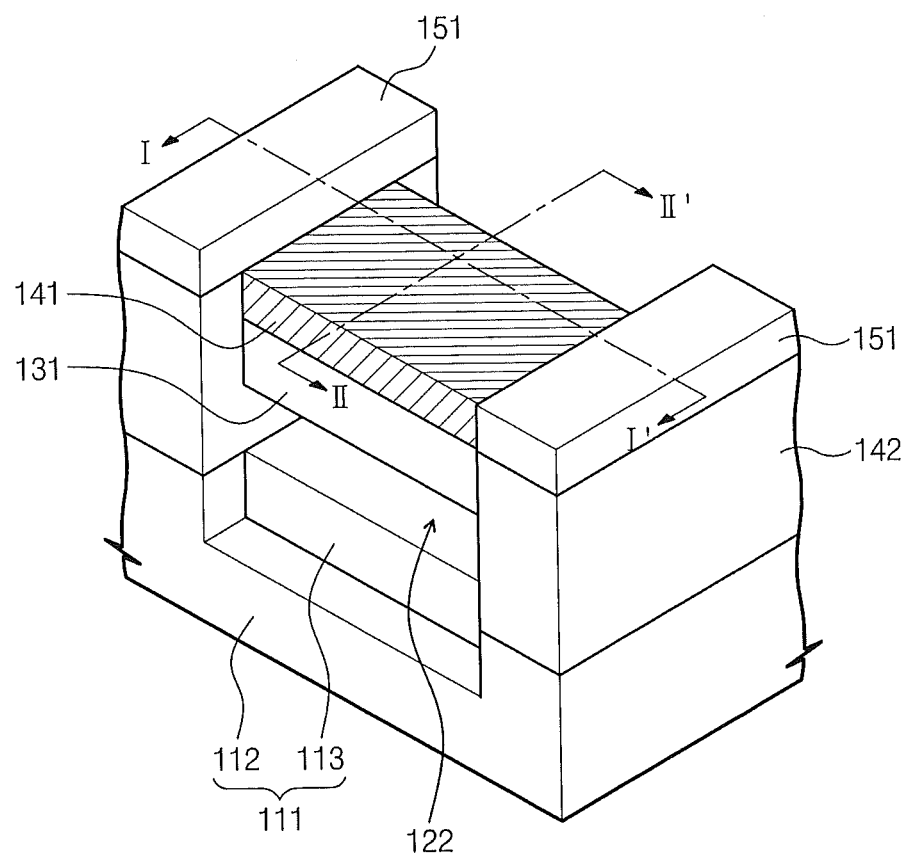
Figure 3B:
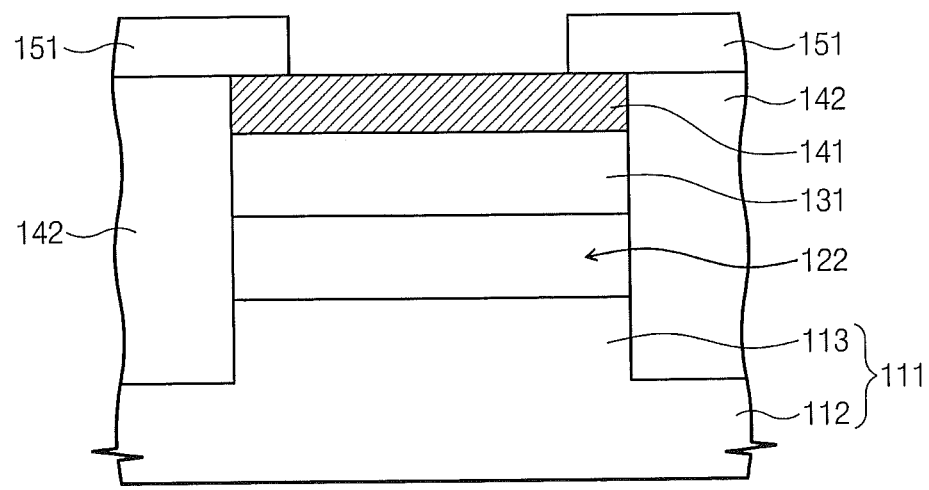
Figure 3C:
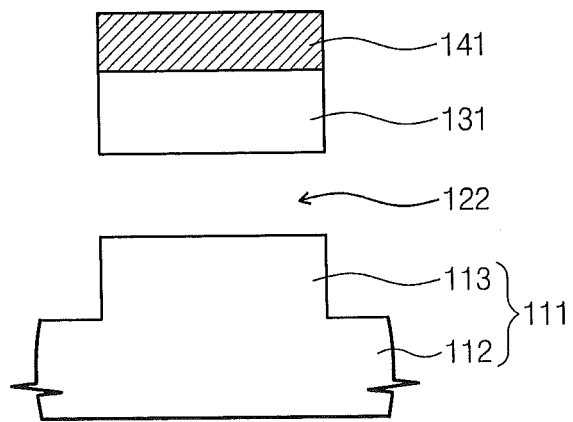

Referring to FIGS. 3A through 3C, a second mask 151 is formed on the upper surface of the structure that is formed in FIGS. 2A through 2C. The second mask 151 may cover only a portion of the first mask 141 and the support dielectric 142.

The support dielectric 142 may be anisotropic etched by using the second mask 151 as an etching mask. Via the anisotropic etching process, the side wall of a stacked structure that includes the sacrificial pattern 121, the active pattern 131 and/or the first mask 141 may be exposed. Moreover, the upper surface of the bottom portion 112 of the semiconductor substrate 111 and/or the side wall of the protrusion portion 113 may be exposed.

Subsequently, the sacrificial pattern 121 may be removed. As described above, the sacrificial pattern 121 may be formed of a material having an etch selectivity with respect to the active pattern 131 and the etched semiconductor substrate 111. Accordingly, the sacrificial pattern 121 may be selectively removed. The support dielectric 142 may support the stacked structure from collapse due to removal of the sacrificial pattern 121.

An empty space 122 is formed at a space where the sacrificial pattern 121 existed. The empty space 122 may be surrounded by the upper surface of the protrusion portion 113 of the semiconductor substrate 111, the lower surface of the active pattern 131 and the support dielectric 142. By forming the empty space 122, the upper surface of the protrusion portion 113 of the semiconductor substrate 111 and the lower surface of the active pattern 131 may be exposed.

Figure 4A:
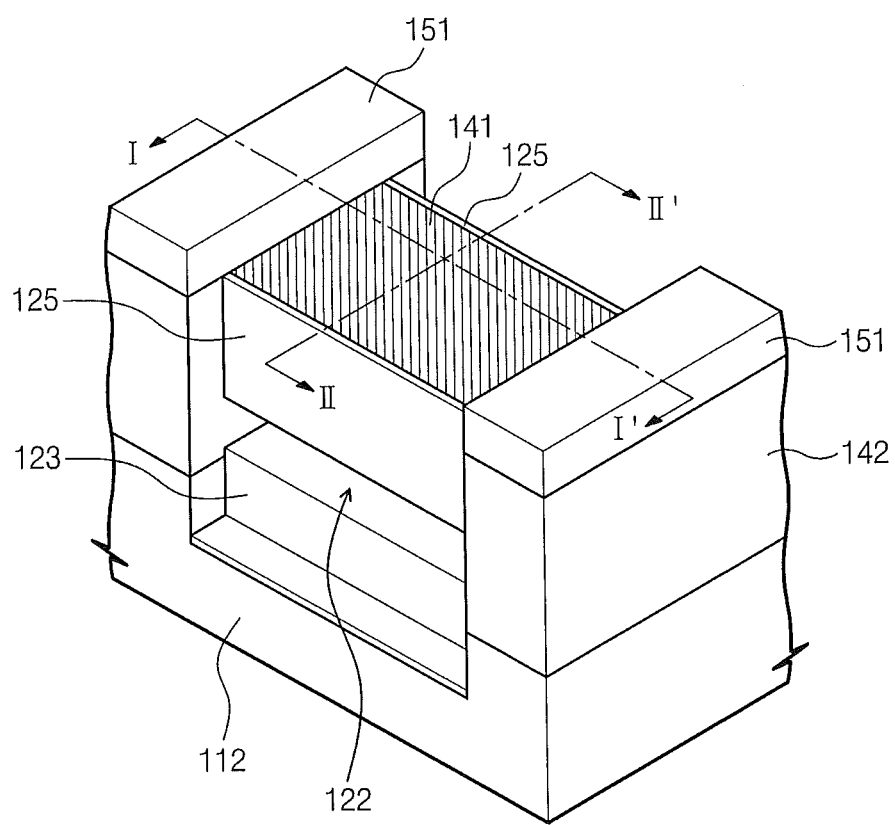
Figure 4B:
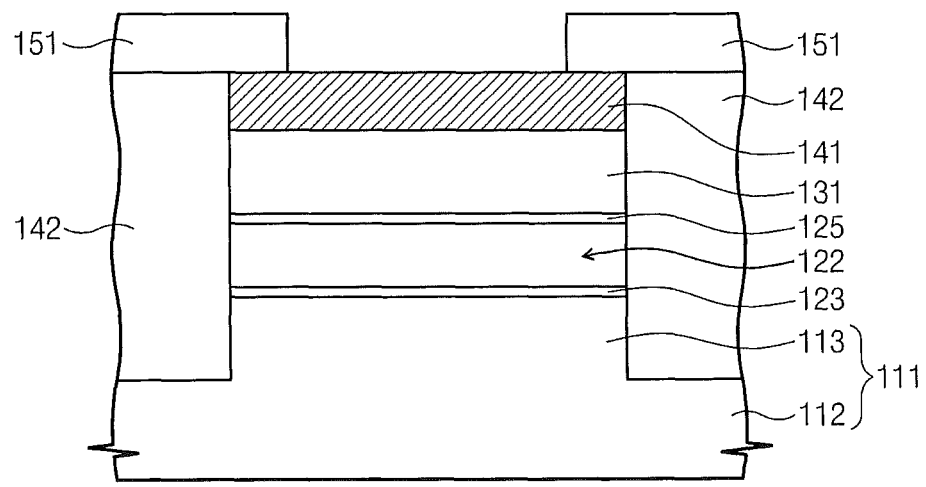
Figure 4C:
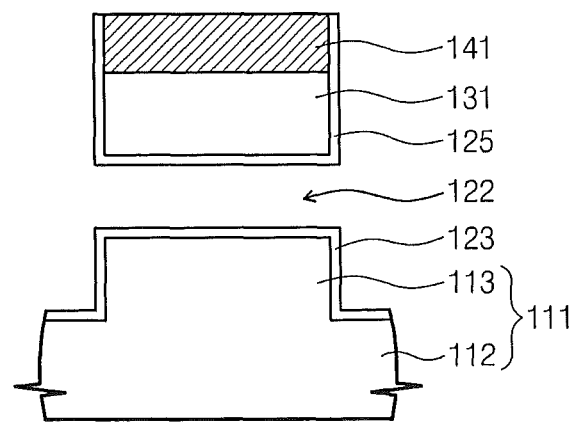

Referring to FIGS. 4A through 4C, isolation dielectrics 123 and 125 may be formed on the semiconductor substrate 111 and the surfaces that are exposed by the empty space 122, and the side surface of the stacked structure. The isolation dielectrics 123 and 125 may include a second isolation dielectric 123 that is formed on the upper surface of the bottom portion 112 of the semiconductor substrate 111 and the side wall and upper surface of the protrusion portion 113 of the semiconductor substrate 111, and a first isolation dielectric 125 that is formed on the lower surface and side wall of the active pattern 131. The first and second isolation dielectrics 125 and 123 may be formed to a very thin thickness. In some embodiments, the first and second isolation dielectrics 125 and 123 may be formed to a thickness less than or equal to about 10 nm.

The isolation dielectrics 125 and 123 may include at least one of dielectric layers that include an oxide layer, a nitride layer and/or an oxynitride layer, among others. In some embodiments, the isolation dielectrics 125 and 123 may be an ONO layer. The ONO layer forming process may include oxidizing the exposed surfaces of the semiconductor substrate 111 and the active pattern 131 to form a first oxide layer, depositing a nitride layer which covers the first oxide layer and forming a second oxide layer on the nitride layer.

Figure 5A:
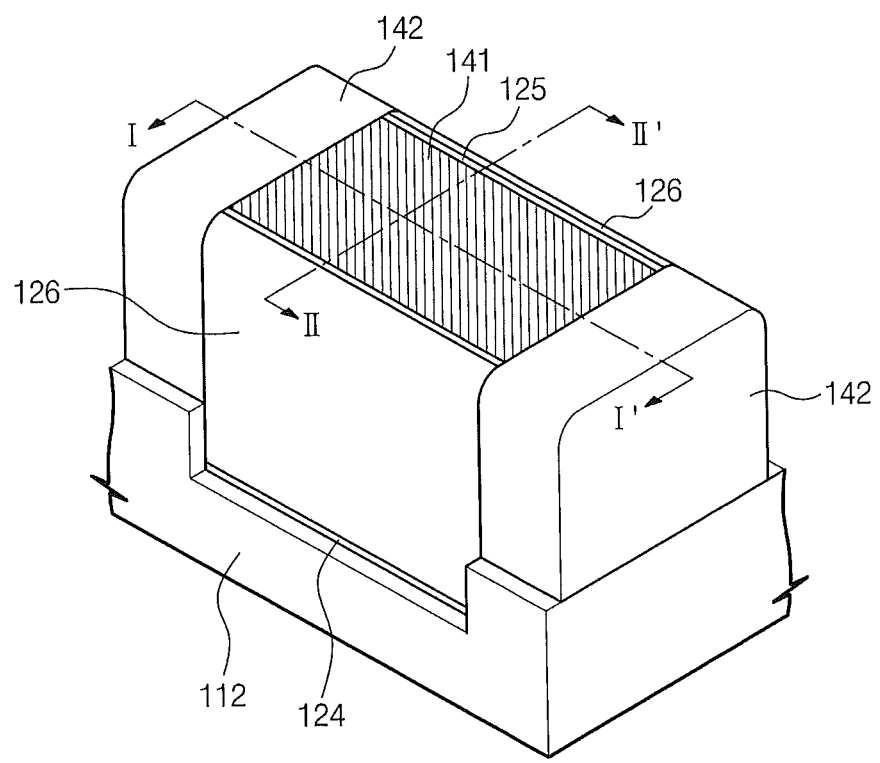
Figure 5B:
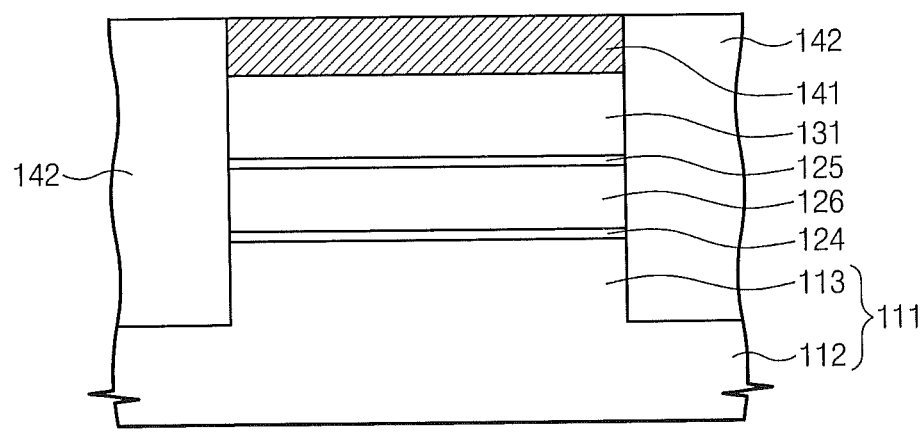
Figure 5C:
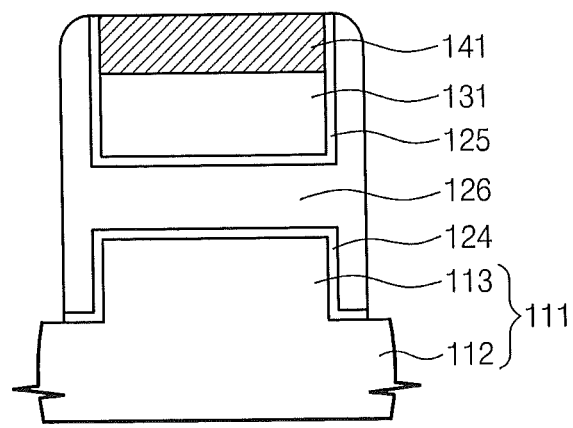

Referring to FIGS. 5A through 5C, a semiconductor layer 126 is formed between the active pattern 131 and the semiconductor substrate 111. The semiconductor layer 126 may fill the empty space 122. The semiconductor layer may be extended onto the side wall of the stacked structure. The semiconductor layer 126 may cover the entirety of the protrusion portion 113 of the semiconductor substrate 111 and a portion of the bottom portion 112 of the semiconductor substrate 111. The semiconductor layer 126 may be formed by performing a deposition, and chemical mechanical polishing process and/or an etch back process. In performing the chemical mechanical polishing process, the second mask 151 may also be removed together.

The semiconductor layer 126 may include a semiconductor material. For example, the semiconductor layer 126 may include a semiconductor material having an amorphous state. The semiconductor layer 126 may include a semiconductor in which dopants are doped. In some embodiments, the semiconductor layer 126 may include an undoped semiconductor material. In doping dopants in the semiconductor layer 126, the dopants may be injected into a layer through an in-situ process during a layer forming process, and/or may be injected into the layer through an ion implant process after formation of the layer. The semiconductor layer 126 may be changed into a semiconductor material having a multi-crystal state during a subsequent process.

In some embodiments, the semiconductor layer 126 may be doped and the channel region of the active pattern 131 may not be doped. In this case, the threshold voltage variation of the semiconductor device, which is formed using the semiconductor layer 126 and the active pattern 131, may decrease.

In the case when dopants are doped in the channel region of the active pattern 131, a dopant concentration profile in the active pattern 131 may not result in a desired form. That is, random dopant fluctuation in the active pattern 131 may occur. The threshold voltage of a transistor including the active pattern 131 may not result in a desired value. Particularly, when the dopants are injected through an ion implant process, the random dopant fluctuation may be more severe.

According to some embodiments of the present invention, however, in a case of doping the semiconductor layer 126, the dopant concentration profile of the semiconductor layer 126 may be closer to a desired form. That is, when dopants are injected into the active pattern 131, the dopant concentration profile in the semiconductor layer 126 may be more conformal than the dopant concentration profile in the active pattern 131. Accordingly, in a case of doping the semiconductor layer 126 and forming the semiconductor device using the doped semiconductor layer 126, the random dopant fluctuation may be reduced. Therefore, the threshold voltage variation of a device may be greatly decreased.

After forming the semiconductor layer 126, a portion of the isolation dielectric 123 may be etched and thereby the second isolation dielectric pattern 124 may be formed. By etching the isolation dielectric 123, a portion of the upper surface of the semiconductor substrate 111 is exposed. When the semiconductor substrate 111 includes the protrusion portion 113 and the bottom portion 112, a portion of the bottom portion 112 may be exposed.

Figure 6A:
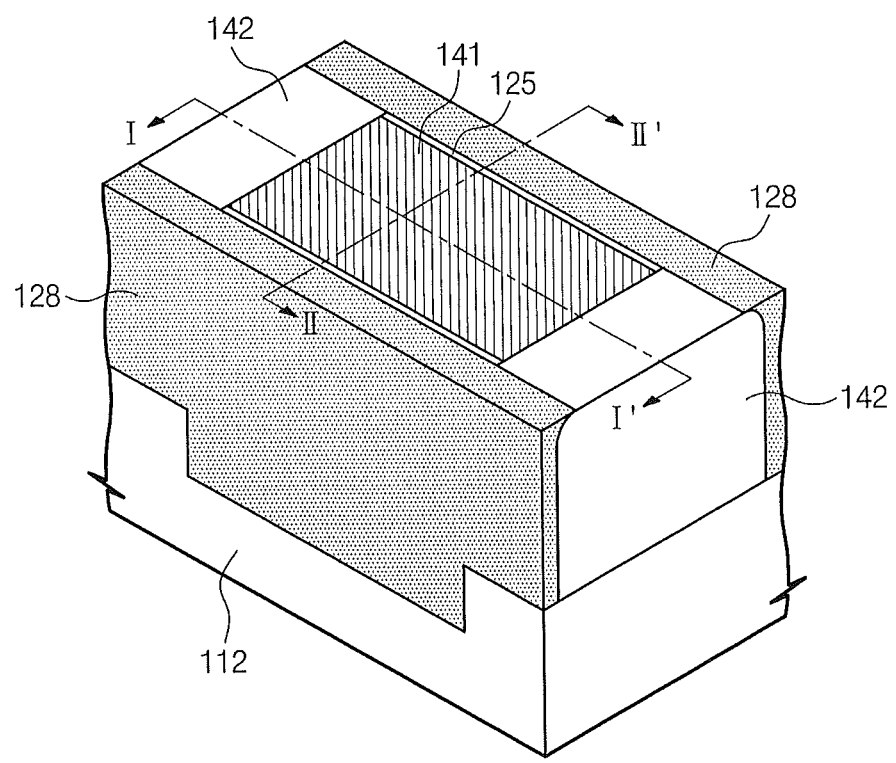
Figure 6B:
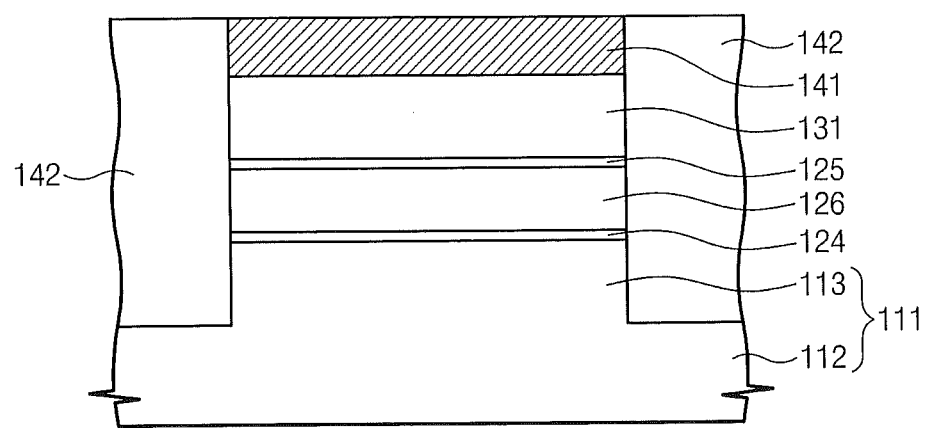
Figure 6C:
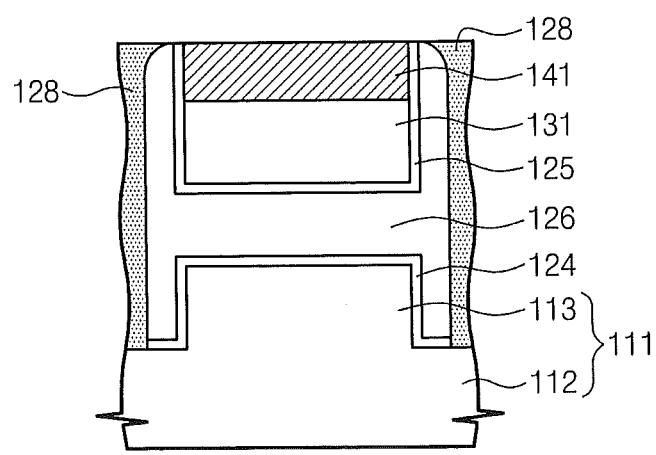

Referring to FIGS. 6A through 6C, a connection layer 128 may be formed on the exposed semiconductor substrate 111. The connection layer 128 may be formed by performing a deposition and chemical mechanical polishing process and/or an etch back process. The connection layer 128 may be formed on the upper surface of the bottom portion 112 of the semiconductor substrate 111. The connection layer 128 may be formed to cover the side wall of the semiconductor layer 126. The connection layer 128 may be formed of a material that may electrically connect the semiconductor substrate 111 and the semiconductor layer 126. For example, the connection layer 128 may include a semiconductor material and/or a conductive material. The connection layer 128 may include a doped semiconductor material, an undoped semiconductor material and/or a metal compound material, among others.

In some embodiments, the semiconductor layer 126 and the connection layer 128 may be simultaneously formed. For example, the semiconductor layer 126 and the connection layer 128 may be simultaneously formed by forming a semiconductor material layer on the empty space 122, the side wall of the active pattern 131 and/or the side wall of the protrusion portion 113 of the semiconductor substrate 111. Etching the semiconductor layer to expose the substrate may be omitted in this case. In this case, an etching process for the second isolation dielectric 123 may be performed before forming the semiconductor layer 126 and the connection layer 128. At least one portion of the second isolation dielectric 123 on the bottom portion 112 of the semiconductor substrate 111 may be removed by the etching process for the second isolation dielectric. Via the etching process for the second isolation dielectric 123, a portion of the bottom portion 112 of the semiconductor substrate 111 may be exposed.

Figure 7A:
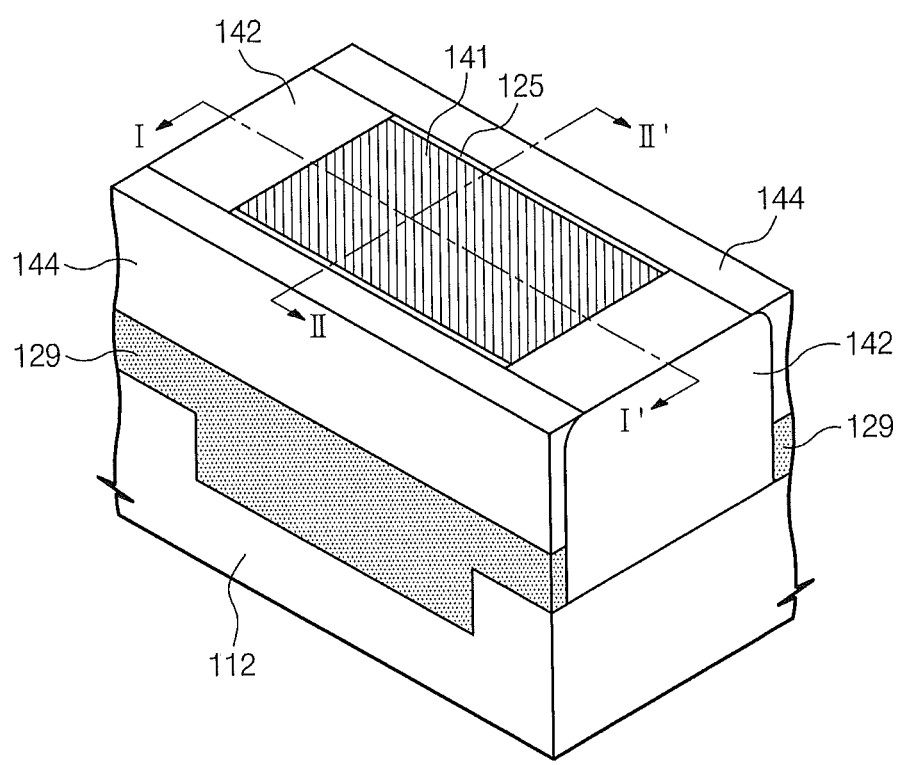
Figure 7B:
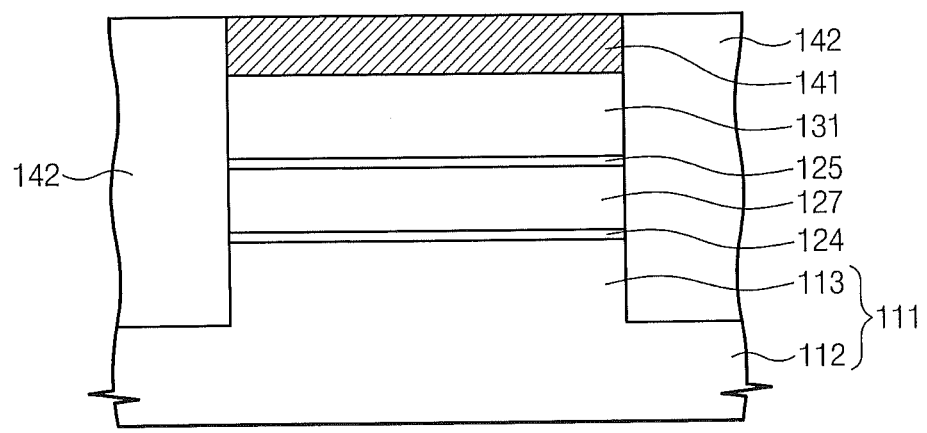
Figure 7C:
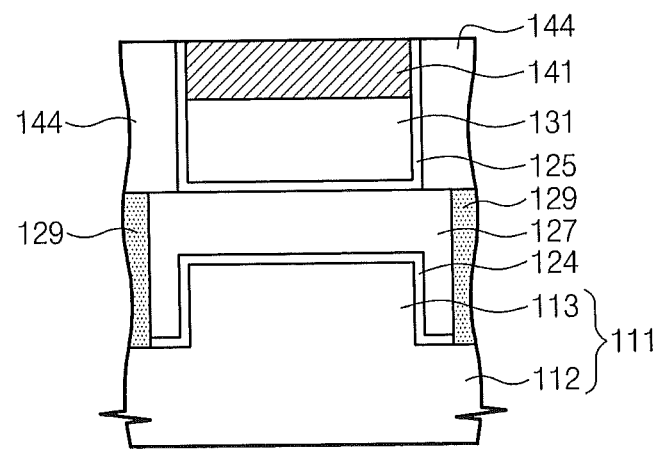

Referring to FIGS. 7A through 7C, the upper portions of the connection layer 128 and the semiconductor layer 126 may be etched. In some embodiments, the semiconductor layer 126 and the connection layer 128 may be simultaneously etched. Consequently, the semiconductor pattern 127 and the connection pattern 129 may be formed. A portion of a sidewall of the first isolation dielectric pattern 125 may be exposed by the etching for the connection layer 128 and the semiconductor layer 126. Although not illustrated, the upper surfaces of the connection pattern 129 and the semiconductor pattern 127 may be disposed at a position lower than the lower surface of the first isolation dielectric pattern 125. Moreover, the upper surfaces of the connection pattern 129 and the semiconductor pattern 127 may be disposed at a position higher than the upper surface of the second isolation dielectric pattern 124.

An interlayer dielectric 144 may be formed on the semiconductor pattern 127 and the connection pattern 129. The upper surface of the interlayer dielectric 144 is planarized, and thus the planarized upper surface of interlayer dielectric 144 and an upper surface of the support dielectric 142 may be coplanar. The interlayer dielectric 144 may cover the side wall of the exposed first isolation dielectric pattern 125. The side walls of the active pattern 131 may be surrounded by the support dielectric 142 and the interlayer dielectric 144.

Figure 8A:
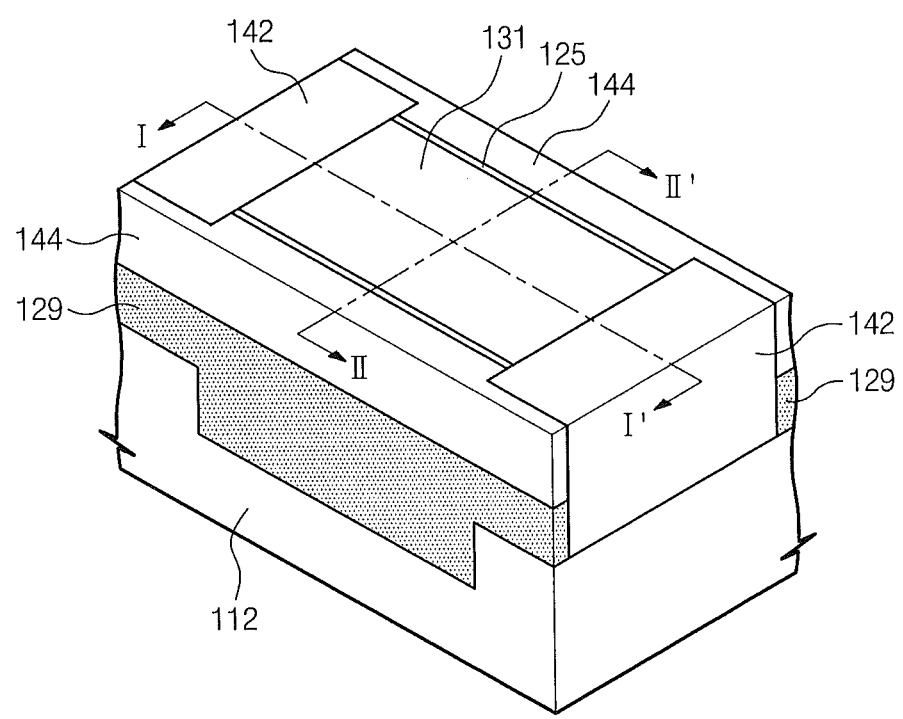
Figure 8B:
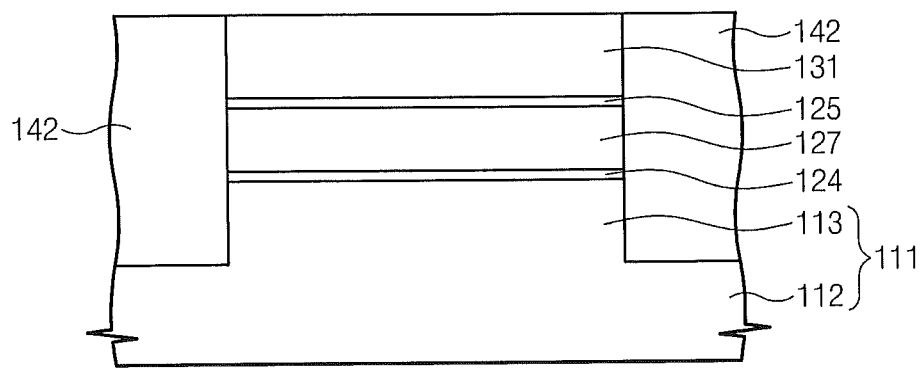
Figure 8C:
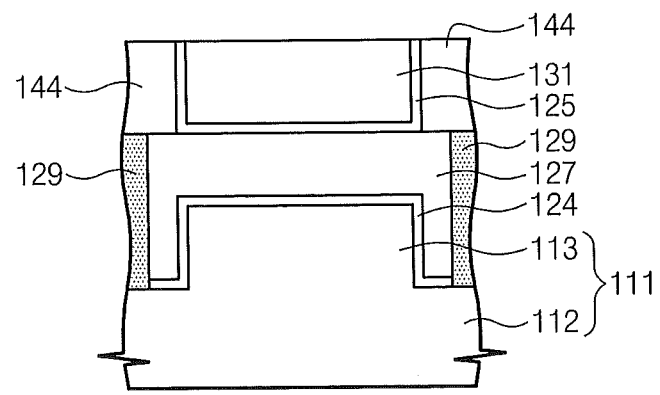

Referring to FIGS. 8A through 8C, the first mask 141 is removed. When the first mask 141 is removed, a portion of the first isolation dielectric pattern 125 and a portion of the interlayer dielectric 144 may be etched. By removing the first mask 141, the upper surface of the active pattern 131 may be exposed.

Figure 9A:
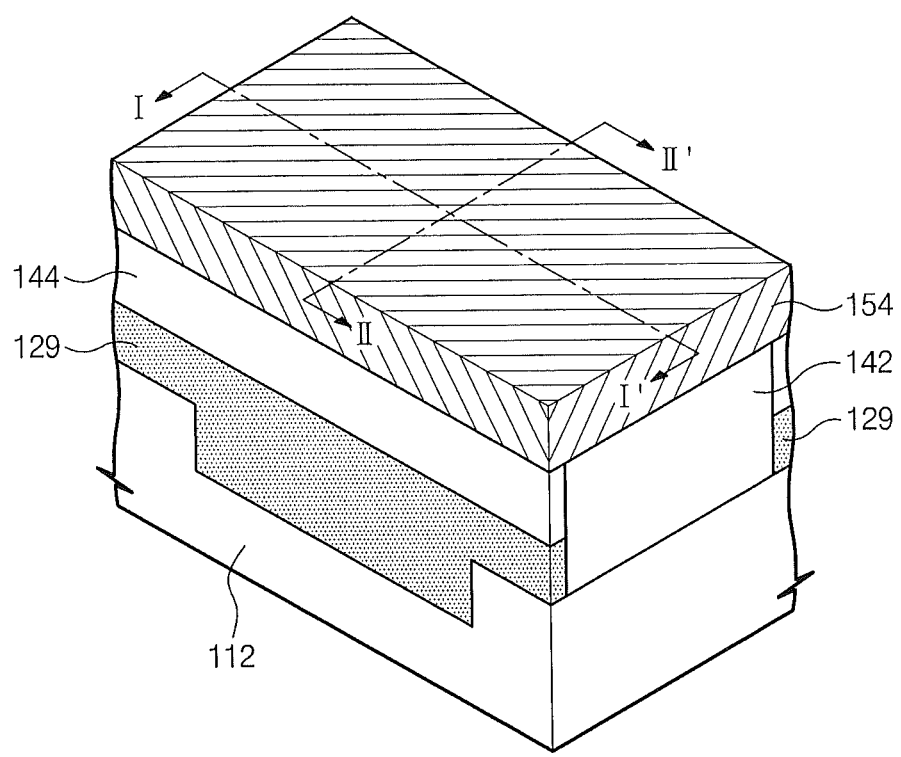
Figure 9B:
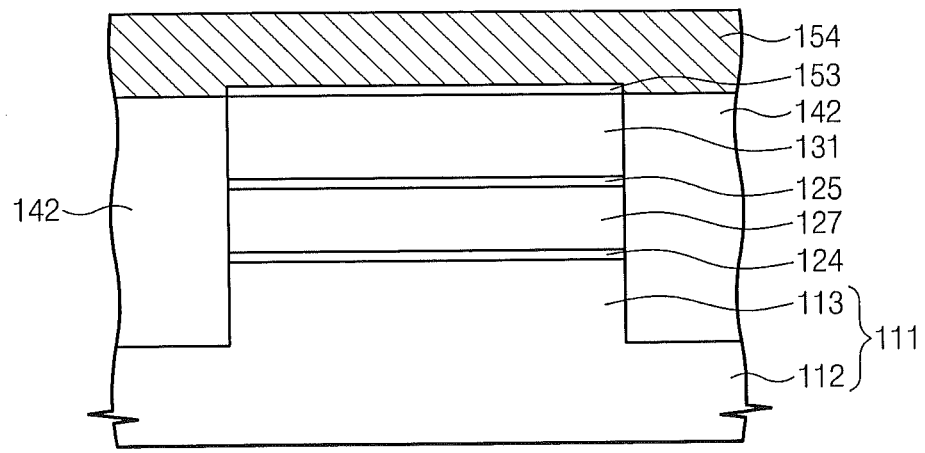
Figure 9C:
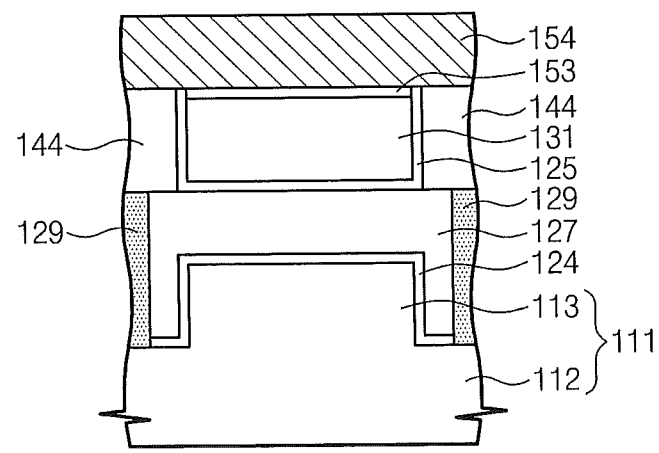

Referring to FIGS. 9A through 9C, a gate dielectric 153 may be formed on the upper surface of the active pattern 131. The gate dielectric 153 may be at least one of multiple dielectric layers that may include an oxide layer, a nitride layer and/or an oxynitride layer, among others. In some embodiments, the gate dielectric 153 may be formed by thermal oxidizing the upper surface of the active pattern 131.

A gate layer 154 may be formed on the gate dielectric 153. The gate layer 154 may include a doped semiconductor material, a metal and/or a metal compound, among others.

Referring to FIGS. 10A through 10C, a gate electrode 155 may be formed by anisotropic etching the gate layer 154. The gate electrode 155 may be extended in a direction vertical to the length direction of the active pattern 131. The spacer 156 may be formed on the both side walls of the gate electrode 155.

Before and/or after formation of the spacer 156, the source/drain region 135 may be formed in the active pattern 131 of the both sides of the gate electrode 155. The source/drain region 135 may be formed by injecting dopants into the active pattern 131 through an ion injection process that uses the spacer 156 as a mask.

Figure 18A:
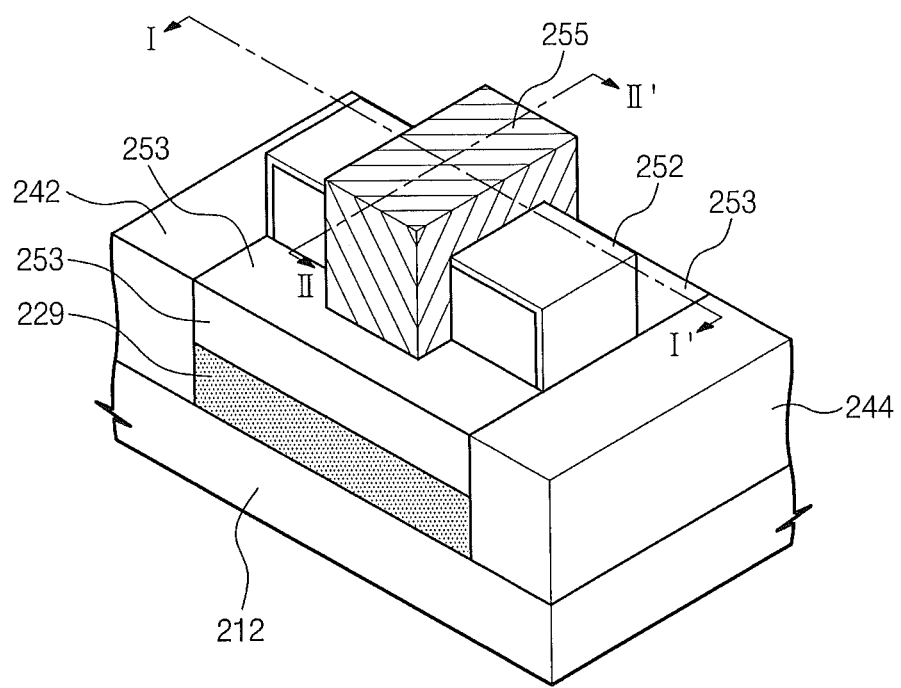
Figure 18B:
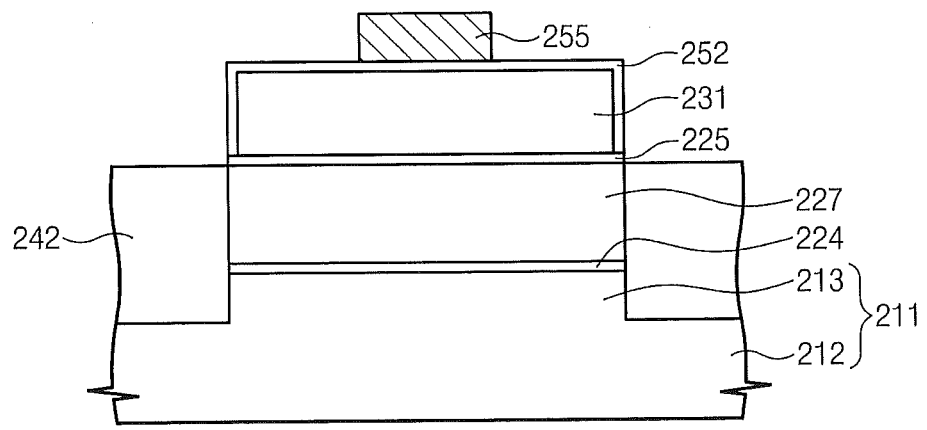
Figure 18C:
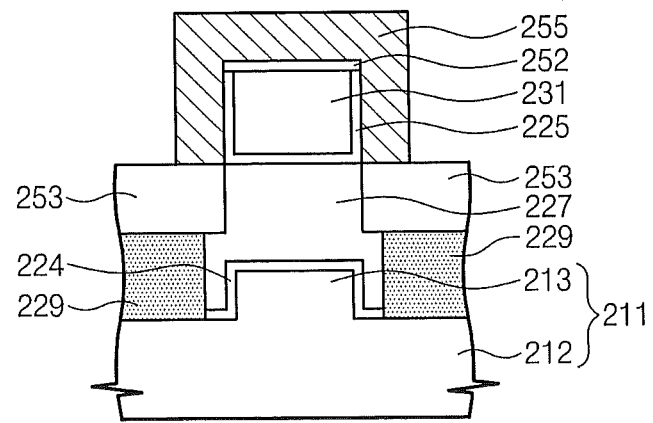

A semiconductor device according to some embodiments of the present invention will be described below with reference to FIGS. 18A through 18C. FIG. 18A is a perspective view illustrating a semiconductor device according to some embodiments of the present invention. FIGS. 18B and 18C are cross-sectional views of the semiconductor device taken along lines I-I' and II-II' of FIG. 18A. FIGS. 18A through 18C illustrate a semiconductor device having a fin type of active pattern.

A semiconductor substrate 211 is provided. The semiconductor substrate 211 may include a bottom portion 212, and a protrusion portion 213 that protrudes from the bottom portion 212. A second isolation dielectric pattern 214 is disposed on the upper surface and side surface of the protrusion portion 213 of the semiconductor substrate 211. A portion of the second isolation dielectric pattern 213 may be extended to the upper surface of the bottom portion of the semiconductor substrate 211.

A semiconductor pattern 227 is disposed on the protrusion portion 213 of the semiconductor substrate 211. The semiconductor pattern 227 may be separated from the semiconductor substrate 211 by the second isolation dielectric pattern 224. The semiconductor pattern 227 may include at least one semiconductor material. For example, the semiconductor pattern 227 may include a semiconductor material having a multi-crystal state.

A connection pattern 229, which connects the semiconductor substrate 211 and the semiconductor pattern 227, is disposed. The connection pattern 229 may electrically connect the semiconductor substrate 211 and the semiconductor pattern 227 that are spatially separated. That is, the semiconductor pattern 227 is electrically connected to the semiconductor substrate 211 via the connection pattern 229.

The active pattern 231 may be disposed on the semiconductor pattern 227. The active pattern 231 may include at least one semiconductor material. For example, the active pattern 231 may include a semiconductor material having a single crystal state. In some embodiments, the active pattern 231 may include a rounded edge. For example, the active pattern 231 may be formed in a nano wire type.

A first isolation dielectric 225 surrounding the active pattern 231 may be disposed. The first isolation dielectric 225 may be disposed on the lower surface of the active pattern 231 and a portion of the side wall of the active pattern 231. The first isolation dielectric 225 may be extended onto the upper surface of the active pattern 231. Some embodiments provide that a gate dielectric 252 may be disposed on the active pattern 231. The first isolation dielectric 225 may spatially separate the active pattern 231 from other elements. That is, the first isolation dielectric 225 may be the buried oxide of the SOI region in the semiconductor substrate.

The first isolation dielectric 225 may be at least one of dielectric layers that include an oxide layer, a nitride layer and/or an oxynitride layer, among others. For example, the first isolation dielectric 225 may be an ONO layer. A gate electrode 255 may be disposed on the upper surface and side wall of the active pattern 231. The gate electrode 255 may cover a portion of the active pattern 231. Although not illustrated, the gate electrode 255 may be extended onto a portion of the lower surface of the active pattern 231. Specifically, the gate electrode 255 may be extended to the edge portion of a lower surface. A transistor that may be formed in this manner may be an omega type transistor.

Methods for manufacturing semiconductor device according to some other embodiments of the present invention will be described below with reference to FIGS. 11A through 11C, FIGS. 12A through 12C, FIGS. 13A through 13C, FIGS. 14A through 14C, FIGS. 15A through 15C, FIGS. 16A through 16C, FIGS. 17A through 17C and FIGS. 18A through 18C. FIGS. 11A through 18A are perspective views illustrating methods for manufacturing semiconductor devices according to some other embodiments of the present invention. FIGS. 11B through 18B are cross-sectional views taken along lines I-I' of FIGS. 11A through 18A, respectively. FIGS. 11C through 18C are cross-sectional views taken along lines II-II' of FIGS. 11A through 18A, respectively.

Figure 11A:
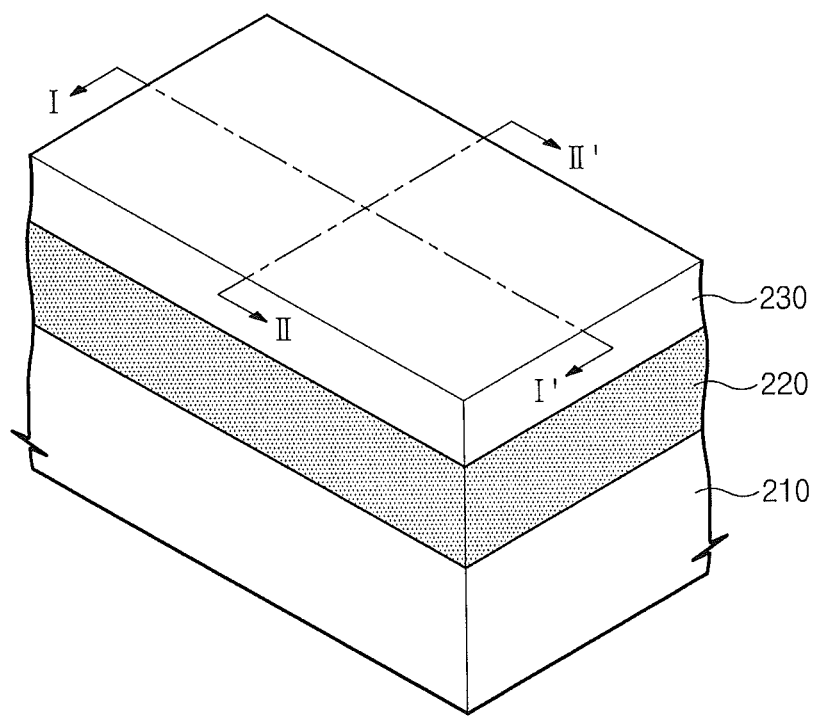
Figure 11B:
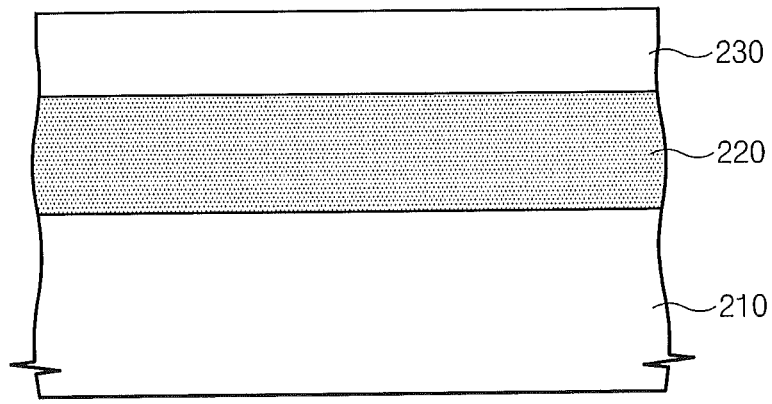
Figure 11C:
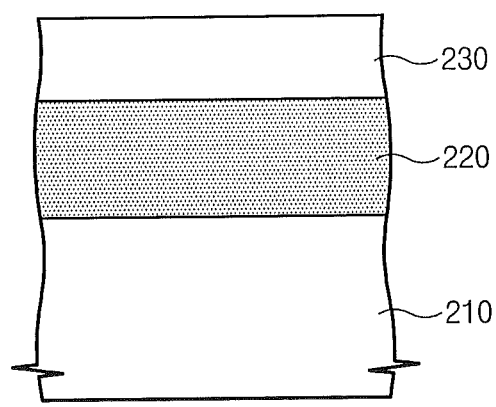

Referring to FIGS. 11A through 11C, a sacrificial layer 220 and an active layer 230 may be sequentially stacked on a semiconductor substrate 210. The descriptions, which have been made above with reference to FIGS. 1A through 1C on the semiconductor substrate, the sacrificial layer and the active layer, may be applied to the following description.

Figure 12A:
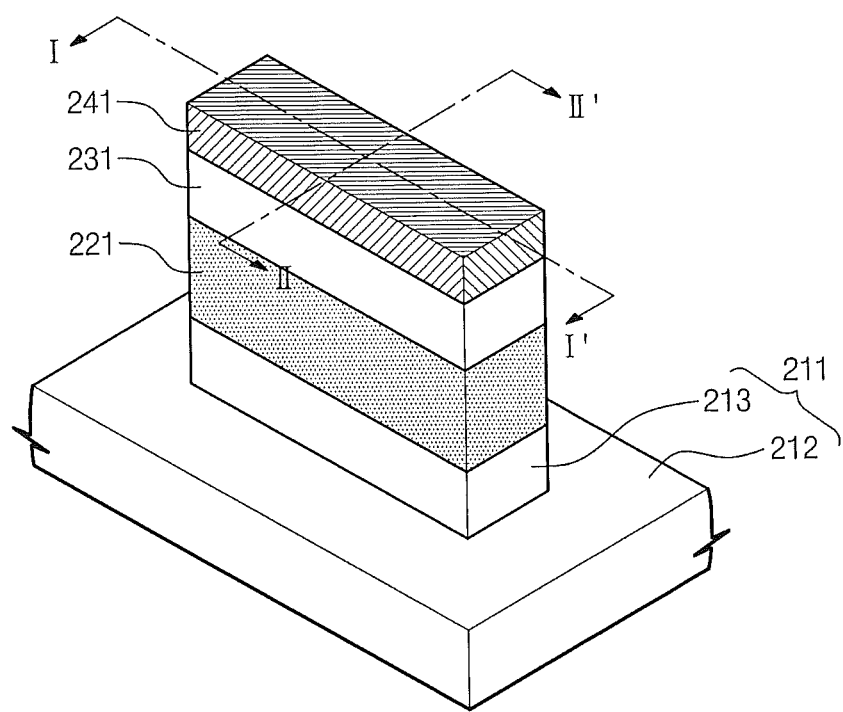
Figure 12B:
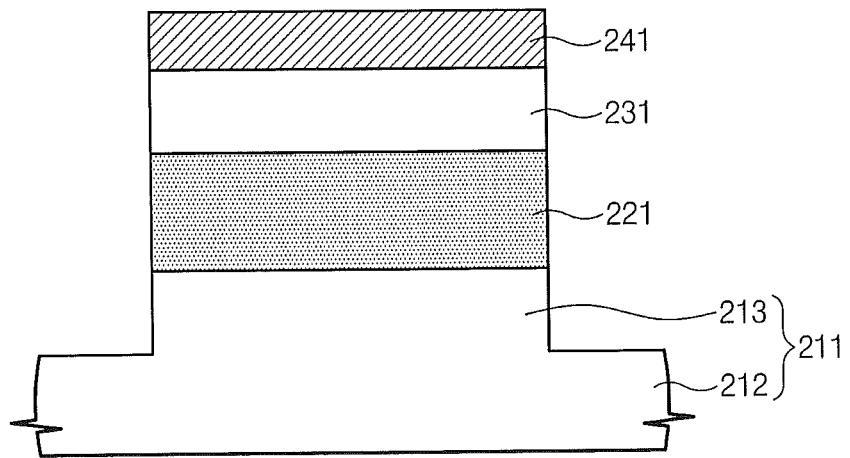
Figure 12C:
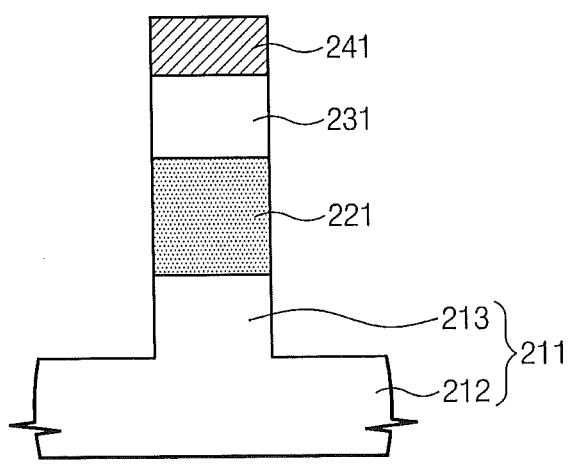

Referring to FIGS. 12A through 12C, an active pattern 231 and a sacrificial pattern 221 may be formed by patterning the active layer 230 and the sacrificial layer 220. A first mask 241 may be formed on the active layer 230 in FIG. 11A, and the active pattern 231 and the sacrificial pattern 221 may be formed by performing an etching process that uses the first mask 241 as an etching mask. When the etching process is performed, the semiconductor substrate 210 may serve as an etch stop layer. At this point, a portion of the semiconductor substrate 210 may be etched. An etched semiconductor substrate 211 may have a protrusion portion 213 and a bottom portion 212.

Figure 13A:
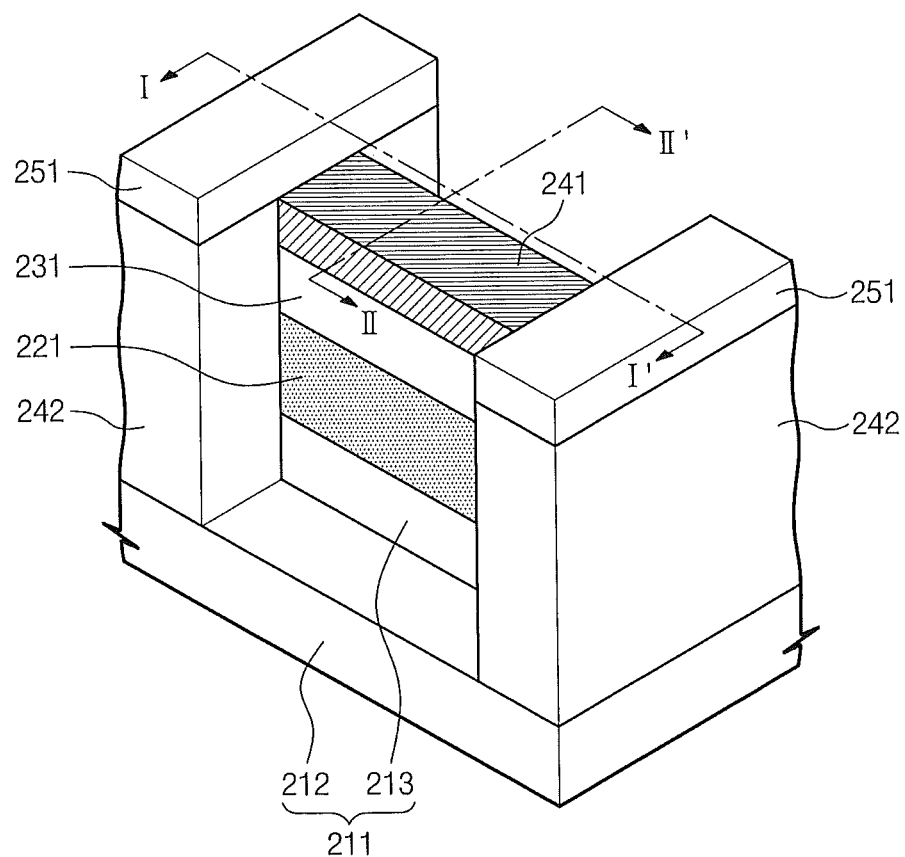
Figure 13B:
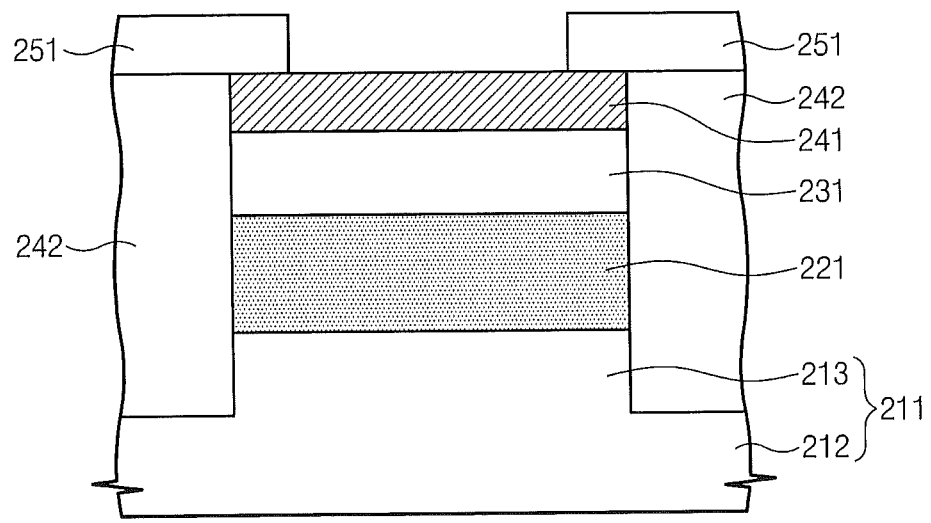
Figure 13C:
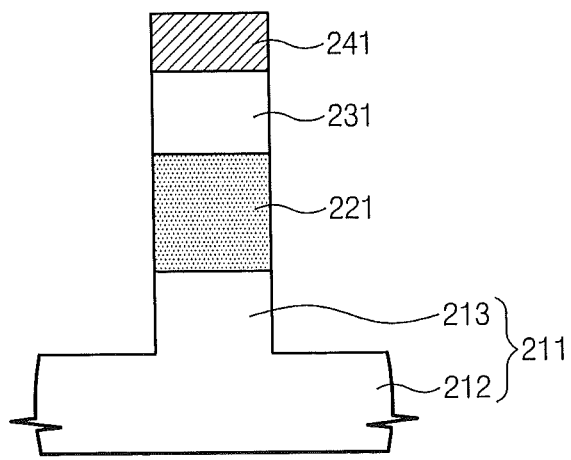

Referring to FIGS. 13A through 13C, a support dielectric 242 that surrounds the both ends of the stacked structure of the active pattern 231 and the sacrificial pattern 221 may be formed. A dielectric layer is formed to cover all the side walls of the stacked structure, and the support dielectric 242 may be formed by etching the dielectric layer in order for a portion of the side wall of the stacked structure to be exposed. The dielectric layer may be etched in an anisotropic etching process using a second mask 251.

Figure 14A:
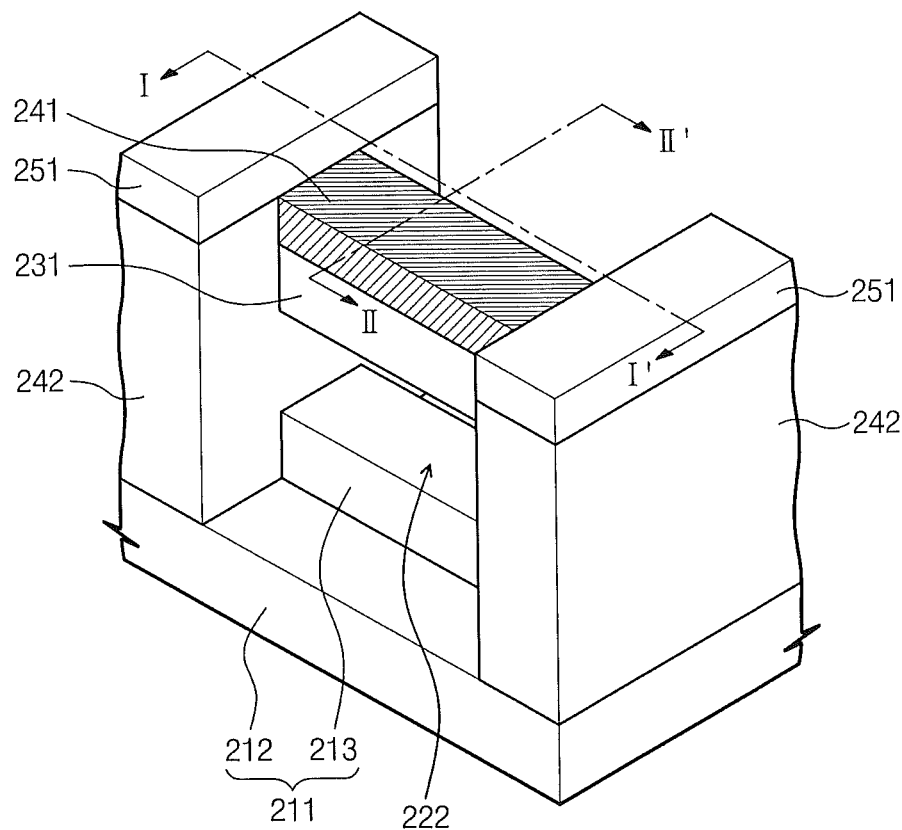
Figure 14B:
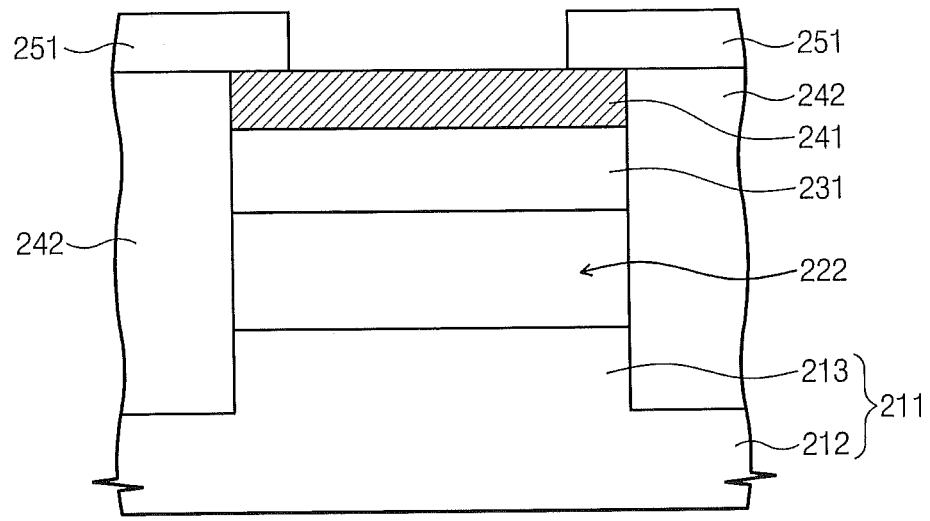
Figure 14C:
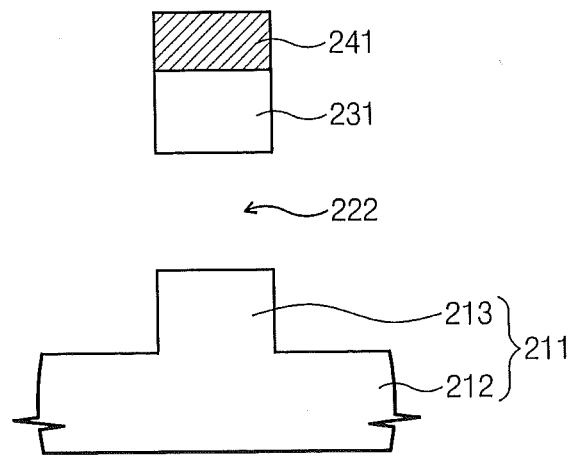

Referring to FIGS. 14A through 14C, an empty space 222 may be formed by removing the sacrificial pattern 221. The empty space 222 may expose the lower surface of the active pattern 231 and the upper surface of the protrusion portion 213 of the semiconductor substrate 211.

Figure 15A:
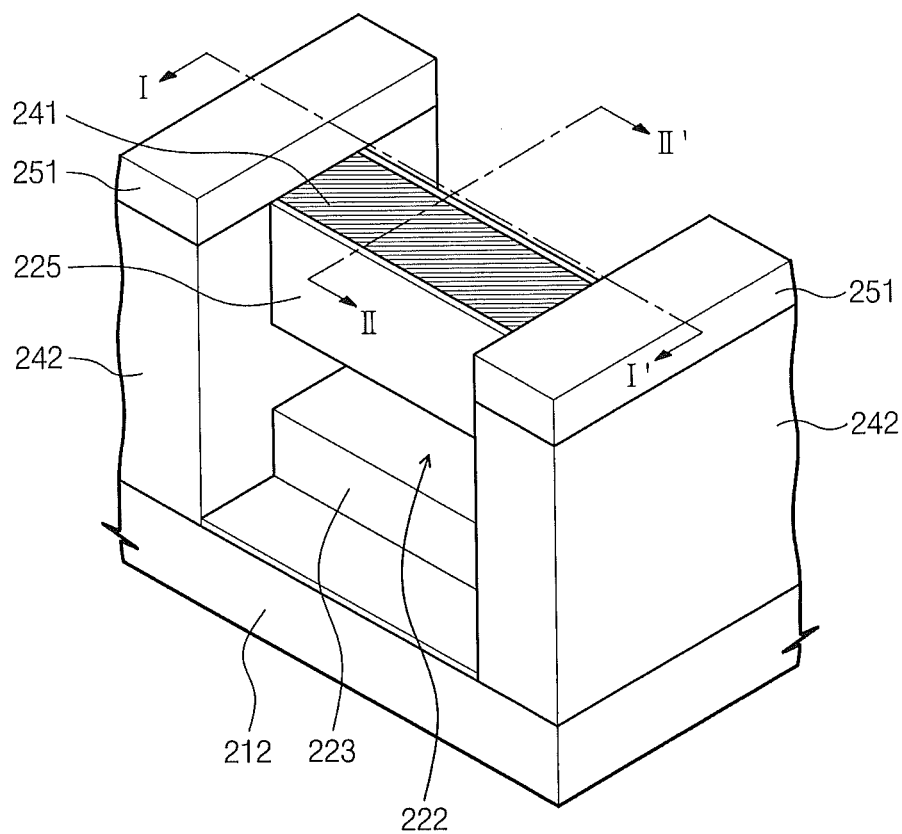
Figure 15B:
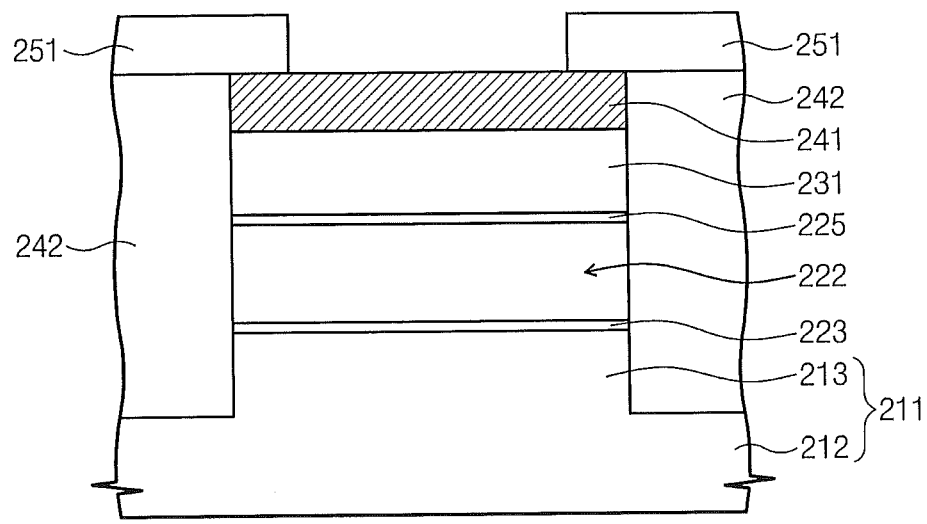
Figure 15C:
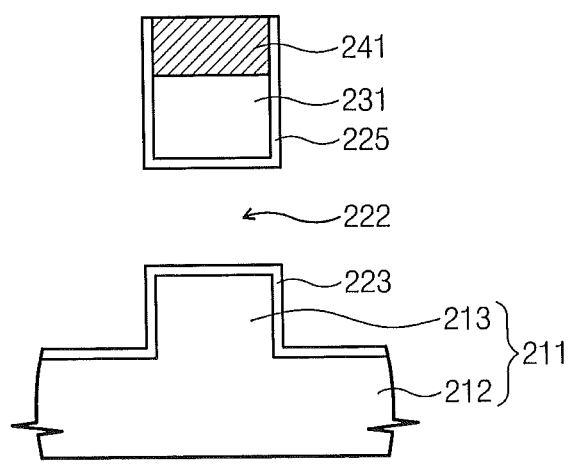

Referring to FIGS. 15A through 15C, the first isolation dielectric 225 may be formed on the lower surface and side wall of the active pattern 231. An isolation dielectric 223 may be formed on the upper surface and side wall of the protrusion portion 213 of the semiconductor substrate 211. The isolation dielectric 223 may also be formed on the upper surface of the bottom portion 212 of the semiconductor substrate 211. The first isolation dielectric 225 and the isolation dielectric 223 may be simultaneously formed.

The first isolation dielectric 225 and the isolation dielectric 223 may include at least one of multiple dielectric layers that include an oxide layer, a nitride layer and/or an oxynitride layer, among others. In some embodiments, the first isolation dielectric 225 and the isolation dielectric 223 may be an ONO layer.

Figure 16A:
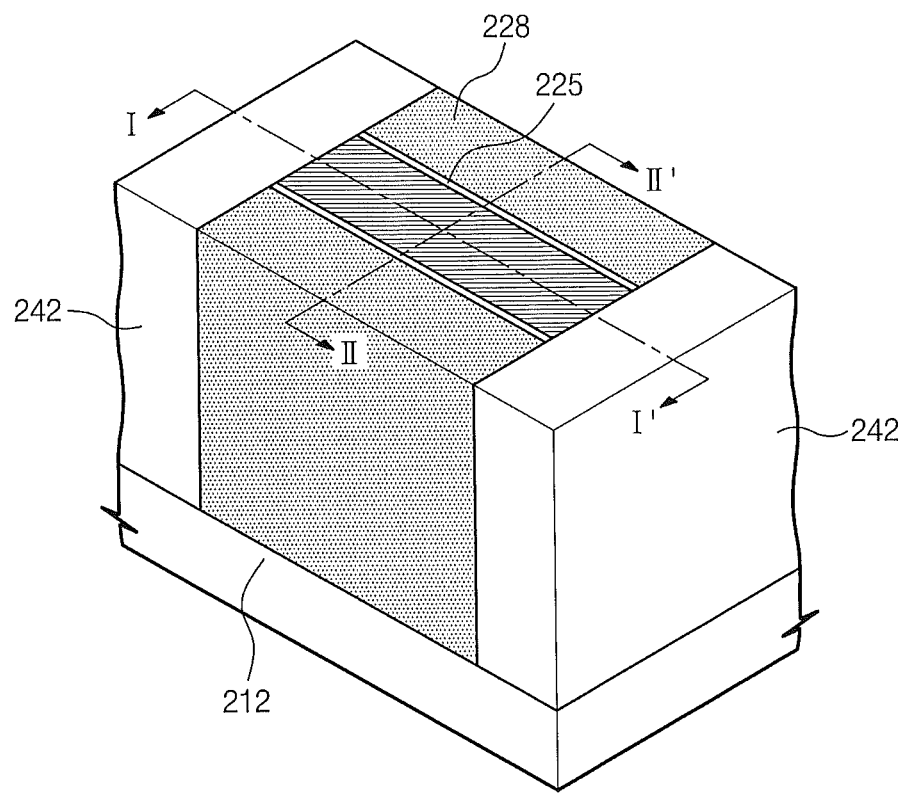
Figure 16B:
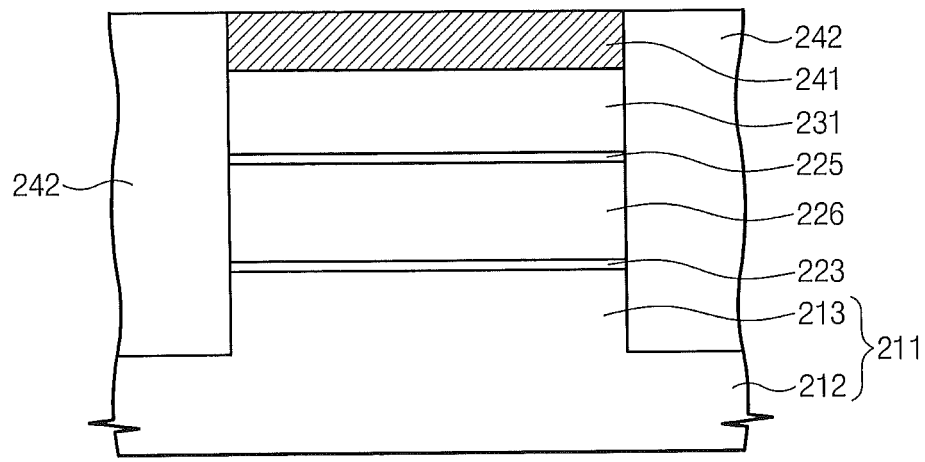
Figure 16C:
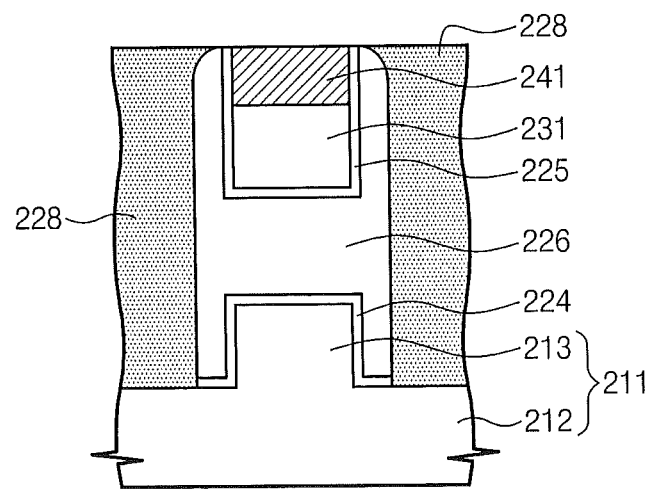

Referring to FIGS. 16A through 16C, a semiconductor layer 226 filling the empty space 222 is formed. A process for forming the semiconductor layer 226 may include forming a semiconductor layer on the semiconductor substrate 211 and anisotropic etching the semiconductor layer. The etching of the semiconductor layer may be performed until the upper surface of the isolation dielectric 223 on the bottom portion 212 of the semiconductor substrate is exposed. Subsequently, the second isolation dielectric pattern 224 is formed by etching the exposed isolation dielectric 223. By etching of the isolation dielectric 223, the upper surface of the bottom portion 212 of the semiconductor substrate is exposed. An etching process for the isolation dielectric 223 may be a wet etching process.

The semiconductor layer 226 may be interposed between the active pattern 231 and the protrusion portion 213 of the semiconductor substrate 211, and may be extended onto the side wall of the active pattern 231 and the protrusion portion 213 of the semiconductor substrate 211.

A connection layer 228 is formed between the semiconductor layer 226 and the semiconductor substrate 211. The connection layer 228 may include the same material as that of the semiconductor layer 226. For example, the connection layer 228 and the semiconductor layer 226 may include a semiconductor material having a multi-crystal state. In some embodiments, the semiconductor layer 226 is formed in an amorphous state, and may be changed into a multi-crystal state due to factors such as heat that occurs during a subsequent process.

In some embodiments, the connection layer 228 and the semiconductor layer 226 may be simultaneously formed. In this case, an etching process for the second isolation dielectric 223 may be first performed. That is, by removing at least one portion of the second isolation dielectric 223 on the bottom portion 212 of the semiconductor substrate 211, at least one portion of the upper surface of the bottom portion 212 of the semiconductor substrate 211 may be exposed.

Figure 17A:
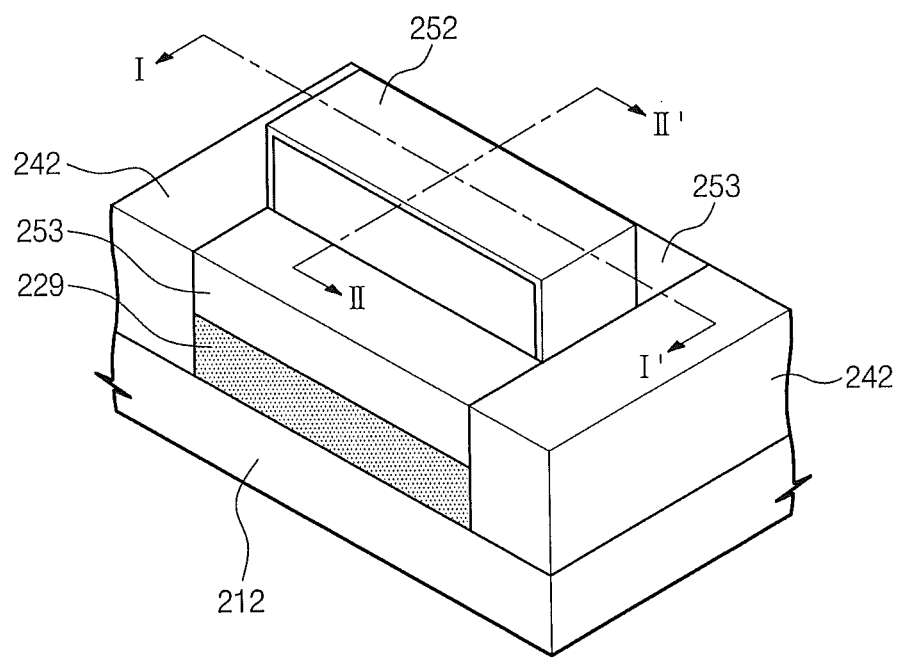
Figure 17B:
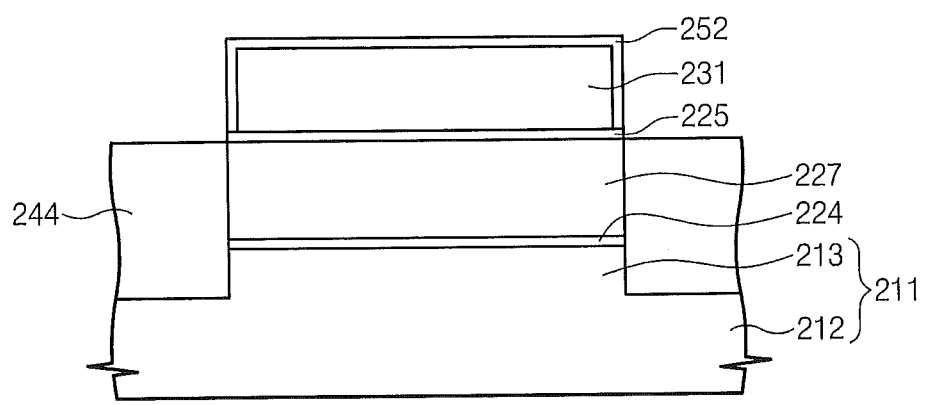
Figure 17C:
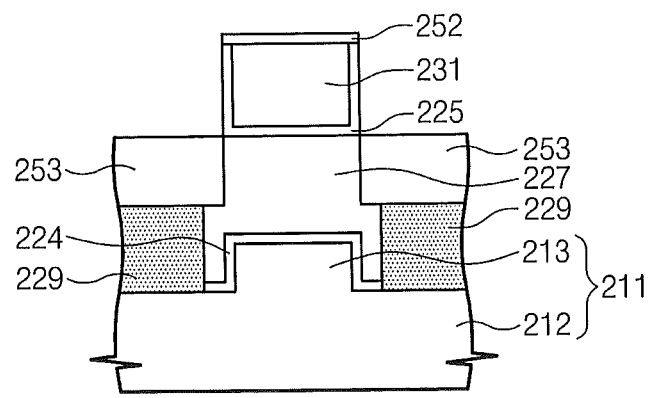

Referring to FIGS. 17A through 17C, the semiconductor pattern 227 and the connection pattern 229 may be formed by etching the semiconductor layer 226 and the connection layer 228. The upper surfaces of the semiconductor pattern 227 and the connection pattern 229 are disposed at a position higher than the upper surface of the isolation dielectric 223. The upper surfaces of the semiconductor pattern 227 and the connection pattern 229 may be disposed at a position lower than the lower surface of the active pattern 231. The etching of the semiconductor layer 226 and the connection layer 228 may be performed until the isolation dielectric 223 is not exposed.

Although not illustrated, an anisotropic etching process for the semiconductor layer 226 and the connection layer 228 may be additionally performed. By this, a portion of lower surface of the first isolation dielectric 225 may be exposed.

The upper surface of the active pattern 231 is exposed by removing the first mask 241. The first isolation dielectric 225 and the support dielectric 242 on the side wall of the first mask 241 may be etched together. The support dielectric 242 may be removed until at least one portion of the side wall of the active pattern 231 is exposed. In some embodiments, the entirety of the support dielectric 242 may be removed.

The gate dielectric 252 is formed on the upper surface of the active pattern 231. The gate dielectric 252 may be formed by oxidizing the upper surface of the active pattern 231. Some embodiments provide that the gate dielectric 252 may be formed by any one of various dielectric forming processes.

An isolation layer 253 may be formed on the connection pattern 229 and the semiconductor pattern 227. The isolation layer 253 may have a lower surface at a position lower than the upper surface of the active pattern 231.

Referring to FIGS. 18A through 18C, the gate electrode 255 covering the upper surface and side wall of the active pattern 231 may be formed. The gate electrode 255 may be formed on the upper surface of the active pattern 231 and, in some embodiments may be extended onto the side wall of the active pattern 231. The gate electrode 255 may include a doped semiconductor material, a metal and/or a metal compound, among others. The gate electrode 255 may be separated from the active pattern 231 by the gate dielectric 252 and the first isolation dielectric 225.

Application examples of some embodiments of the present invention will be described below with reference to FIG. 19.

Figure 19:
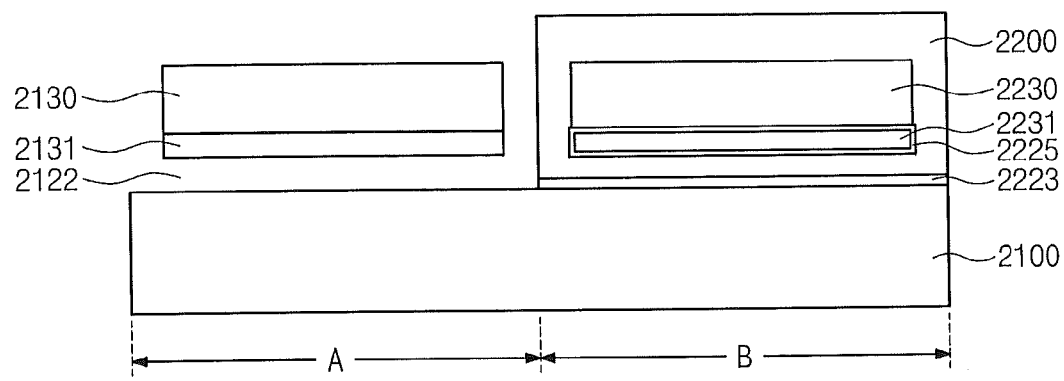
FIG. 19 is a diagram illustrating an example of an application according to some embodiments of the present invention.

Referring to FIG. 19, SOI structures having dielectric layers having different thicknesses may be formed in one semiconductor substrate. In FIG. 19, region A may be an SOI device region including a thin buried oxide and a region B may be an SOI device region including a thick buried oxide.

The region A may be formed by methods described above with reference to FIGS. 1A through 8C. Specifically, a semiconductor substrate 2100 including the regions A and B may be prepared. As illustrated in FIGS. 1A through 1C, a sacrificial layer, an active layer and a first mask 2230 are stacked at the semiconductor substrate 2100. The sacrificial layer and the active layer are anisotropic etched using the first mask 2230 as an etching mask. That is, the sacrificial layer and active layer of the region A are separated from the sacrificial layer and active layer of the region B. Consequently, stacked structures, in which sacrificial patterns and active patterns are stacked at the regions A and B, are formed.

A support dielectric contacting the both ends of the stacked structures is formed. The support dielectric may be similar to the support dielectric 142 that has been described above with reference to FIGS. 2A through 2C. Subsequently, a mask is formed on the support dielectric and an anisotropic etching process is performed using the mask as a mask pattern. In this manner, the side walls of the stacked structures may be exposed.

The sacrificial patterns of the stacked structures are removed. The sacrificial patterns may be removed by a wet etching process. By removing the sacrificial patterns, an empty space 2122 is formed between the active pattern 2131 and the semiconductor substrate 2100. By removal of the sacrificial patterns, the lower surface of the active pattern 2131 and the upper surface of the semiconductor substrate 2100 may be exposed.

A buried oxide 2225 and an isolation dielectric 2223 are formed on the exposed lower surface of the active pattern 2131 and the exposed upper surface of the semiconductor substrate 2100. The buried oxide 2225 and the isolation dielectric 2223 may be simultaneously formed.

A box dielectric 2200 filling the empty space 2122 is formed. The box dielectric 2200 surrounds the patterns of the regions A and B, and may fill the empty space 2122. The box dielectric 2200 of the region A is removed. At this point, the buried oxide 2225 and isolation dielectric 2223 of the region A may be simultaneously removed. Subsequently, as described above with reference to FIGS. 1A and 10C, a buried oxide, an isolation dielectric pattern, a semiconductor pattern and a connection pattern may be formed at the region A.

The above-described buried dielectric may be a thin box surrounding the active region of the region A. Moreover, the box dielectric 2200 of the active region of the region B may be a thick box. Because the active regions of the regions A and B have different separation distances in which they are electrically and/or spatially separated from the substrate, devices including the active regions may represent different characteristics. As illustrated, by applying embodiments of the present invention, structures suitable for the characteristic of each device may be realized in one substrate.

Figure 20:
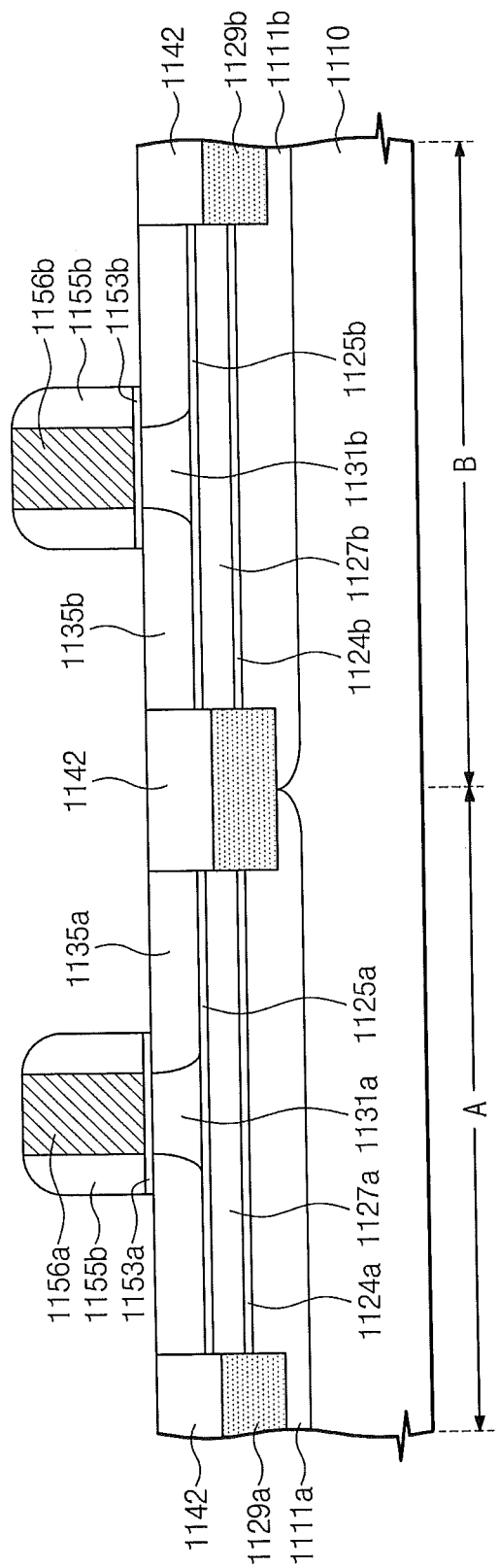
FIG. 20 is a diagram illustrating another example of an application according to some embodiments of the present invention.

Another application example according to some embodiments of the present invention will be described below with reference to FIG. 20. A semiconductor substrate 1110 including the regions A and B is provided.

Well regions 1111*a* and 1111*b* may be provided in the semiconductor substrate 1110 of the regions A and B. In some embodiments, different conductive dopants may be doped on the well regions 1111*a* and 1111*b* of the regions A and B. In some embodiments, the same conductive dopants may be doped on the well regions 1111*a* and 1111*b* of the regions A and B.

Semiconductor patterns 1127*a* and 1127*b* may be disposed on the well regions 1111*a* and 1111*b*. The semiconductor patterns 1127*a* and 1127*b* may include a semiconductor material having a multi-crystal state. The semiconductor patterns 1127*a* and 1127*b* may be electrically connected to the well regions 1111*a* and 1111*b* by connection patterns 1129*a* and 1129*b*.

The well regions 1111*a* and 1111*b* of the regions A and B may be electrically connected to the semiconductor patterns 1127*a* and 1127*b* by the connection patterns 1129*a* and 1129*b*. Moreover, the semiconductor substrate 1110 and the active patterns 1131*a* and 1131*b* may be electrically connected via the semiconductor patterns 1127*a* and 1127*b* and the connection patterns 1129*a* and 1129*b*.

In some embodiments, the regions A and B may include transistors having the same mode. For example, the transistors of an inversion mode may be disposed at the regions A and B. The well region 1111*a* of the region A may be doped with a p-type dopant, and a source/drain region 1135*a* may be doped with an n-type dopant. The gate electrode 1156*a* of the region A may be doped with an n-type dopant. The well region 1111*b* of the region B may be doped with an n-type dopant, and a source/drain region 1135*b* may be doped with a p-type dopant. The gate electrode 1156*b* of the region B may be doped with a p-type dopant.

Some embodiments provide that the transistors of the regions A and B may be the transistors of an accumulation mode. In this case, the well region 1111*a* of the region A may be doped with a p-type dopant, the source/drain region 1135*a* may be doped with an n-type dopant, and the gate electrode 1156*a* may be doped with a p-type dopant. The well region 1111*b* of the region B may be doped with an n-type dopant, the source/drain region 1135*b* may be doped with a p-type dopant, and the gate electrode 1156*b* may be doped with an n-type dopant.

In some other embodiments, the transistor of the region A and the transistor of the region B may include the transistors of different modes. For example, the inversion mode transistor may be disposed at any one of the regions A and B and the accumulation mode transistor may be disposed at another one of the regions A and B. The well regions 1111*a* and 1111*b* of the regions A and B may be doped with the same conductive dopants. The source/drain region 1135*a* of the region A may include the same conductive dopants as those of the well region 1111*a* of the region A, and the source/drain region 1135*b* of the region B may include dopants having conductive type opposite to conductive type of the well region 1111*b*. The gate electrode 1156*a* of the region A may include dopants having conductive type opposite to conductive type of the source/drain region 1135*a*, and the gate electrode 1156*b* of the region B may include the same conductive dopants as those of the source/drain region 1135*b*. In some embodiments, the semiconductor patterns 1127*a* and 1127*b* may also doped with dopants. At this point, the concentration of the dopants of the semiconductor patterns 1127*a* and 1127*b* may be higher than that of the dopants of the well regions 1111*a* and 1111*b*.

According to some embodiments of the present invention, provided are the connection pattern that electrically connects the semiconductor substrate to the active pattern and the SOI device, which has an electrically very thin buried oxide. When the back bias is applied to the semiconductor substrate, the voltage may have influence on the active pattern through the thin buried oxide. That is, the threshold voltage value of the transistor including the active pattern can be easily controlled by the back bias.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the embodiments disclosed herein, and that modifications to the disclosed embodiments, as well as other embodiments, are intended to be included within the scope of the appended claims. The present invention is defined by the following claims.

What is claimed is:

1. A method for manufacturing a semiconductor device, the method comprising:
    forming a stacked structure in which a sacrificial layer and an active layer are sequentially stacked on a semiconductor substrate;
    removing the sacrificial layer to form an empty space between the active layer and the semiconductor substrate;
    forming a first isolation dielectric pattern on the semiconductor substrate in the empty space;
    forming a semiconductor pattern on the semiconductor substrate, the semiconductor pattern filling the empty space and being separated from the semiconductor substrate; and
    forming a connection pattern that electrically connects the semiconductor pattern and the semiconductor substrate, wherein the connection pattern directly contacts a side surface of the semiconductor pattern and the semiconductor substrate at one side of the semiconductor pattern.

2. The method of claim 1, wherein the connection pattern includes a semiconductor material and/or a conductive material.

3. The method of claim 1, wherein the connection pattern and the semiconductor pattern include the same material.

4. The method of claim 1, further comprising forming a second isolation dielectric pattern on a bottom surface of the active layer in the empty space.

5. The method of claim 4, wherein the second isolation dielectric pattern includes the same insulating material as the first isolation dielectric pattern.

6. The method of claim 4, wherein the first isolation dielectric pattern and the second isolation dielectric pattern are formed at the same time.

7. The method of claim 1, wherein a channel region in the active layer comprises an undoped semiconductor material, and the semiconductor pattern comprises a doped semiconductor material.

8. The method of claim 1, wherein the connection pattern directly contacts both a side surface and a top surface of the semiconductor substrate.

9. A method for manufacturing a semiconductor device, the method comprising:
    forming a sacrificial pattern and an active pattern sequentially stacked on a semiconductor substrate;
    removing the sacrificial pattern to form an empty space between the active pattern and the semiconductor substrate;
    forming a first isolation dielectric layer covering a bottom surface of the active pattern;
    forming a second isolation dielectric layer separated from the first isolation dielectric layer on the semiconductor substrate;
    forming a semiconductor layer on the semiconductor substrate, the semiconductor layer filling the empty space and being separated from the semiconductor substrate by the second isolation dielectric layer;
    patterning the semiconductor layer and the second isolation dielectric layer to expose a portion of the semiconductor substrate;
    forming a connection layer on the exposed semiconductor substrate, the connection layer electrically connecting the semiconductor substrate to the semiconductor layer, and directly contacting the semiconductor layer; and
    etching upper portions of the patterned semiconductor layer and the connection layer to form a semiconductor pattern and a connection pattern.

10. The method of claim 9, wherein forming the first isolation dielectric layer comprises performing a thermal oxidation process at a bottom surface of the active pattern, and wherein forming the second isolation dielectric layer comprises performing a thermal oxidation process at a surface of the semiconductor substrate.

11. The method of claim 9, further comprising etching a portion of the semiconductor substrate to form a protruded portion.

12. The method of claim 11, wherein forming the sacrificial pattern, the active pattern and the protruded portion uses a same etching mask.

13. The method of claim 12, wherein a sidewall of the protruded portion is self-aligned relative to a sidewall of the active pattern.

14. The method of claim 9, wherein the semiconductor device includes, from a lowest to highest height, the semiconductor substrate, the semiconductor layer, and the active pattern, and wherein an upper surface of the active pattern and an upper surface of the connection pattern have same levels as or lower levels than a bottommost surface of the first isolation dielectric layer.

15. The method of claim 9, further comprising;
    forming an insulating layer on the semiconductor substrate; and
    forming a gate electrode extending in a length direction of the active pattern on the semiconductor substrate.

16. The method of claim 15, wherein the semiconductor device includes, from a lowest to highest height, the semiconductor substrate, the semiconductor layer, and the active pattern, and wherein an upper surface of the insulating layer has a substantially same level as an upper surface of the semiconductor pattern.

17. The method of claim 15, wherein the semiconductor device includes, from a lowest to highest height, the semiconductor substrate, the semiconductor layer, and the active pattern, and wherein an upper surface of the insulating layer has a lower level than an upper surface of the active pattern and a same level as or a higher level than an uppermost surface of the semiconductor pattern.

18. The method of claim 17, wherein a bottommost surface of the gate electrode has a lower level than the top surface of the active pattern.

19. The method of claim 9, wherein the connection layer directly contacts the semiconductor substrate.

20. The method of claim 19, wherein the connection layer directly contacts both a side surface and a top surface of the semiconductor substrate.

* * * * *